(12) United States Patent
Loprete et al.

(10) Patent No.: US 6,331,925 B1
(45) Date of Patent: *Dec. 18, 2001

(54) TWO STAGE RECIPROCATING COMPRESSORS AND ASSOCIATED HVAC SYSTEMS AND METHODS

(75) Inventors: Joseph F. Loprete; Michael R Young; John W Tolbert, Jr., all of Bristol, TN (US); David T Monk, Bristol, VA (US); Philip C Wagner, Bristol, TN (US); Joe T Hill, Bristol, VA (US); Larry Pippin, Bristol, VA (US); Robert B. Peters, Bristol, VA (US)

(73) Assignee: Bristol Compressors, Inc., Bristol, VA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/605,432

(22) Filed: Jun. 29, 2000

Related U.S. Application Data

(60) Division of application No. 09/133,841, filed on Aug. 13, 1998, now Pat. No. 6,132,177, which is a continuation-in-part of application No. 08/911,481, filed on Aug. 14, 1997, now Pat. No. 6,092,993.

(51) Int. Cl.$^7$ ...................................................... H02H 7/00
(52) U.S. Cl. ................................. 361/22; 361/23; 361/25; 361/115
(58) Field of Search ..................... 361/22, 23, 25, 361/115

(56) References Cited

U.S. PATENT DOCUMENTS

| | | | |
|---|---|---|---|
| 3,855,509 | * 12/1974 | Wright | 318/227 |
| 4,031,778 | 6/1977 | Fazekas | 74/571 L |
| 4,236,874 | 12/1980 | Sisk | 417/315 |
| 4,242,626 | 12/1980 | Gross | 318/772 |
| 4,245,966 | 1/1981 | Riffe | 417/312 |
| 4,248,053 | 2/1981 | Sisk | 62/158 |
| 4,396,359 | 8/1983 | Kropiwnicki | 417/312 |
| 4,472,670 | 9/1984 | Stanley | 318/774 |
| 4,479,419 | 10/1984 | Wolfe | 92/13.3 |
| 4,494,447 | 1/1985 | Sisk | 92/13.3 |
| 4,503,371 | 3/1985 | Sugita | 318/493 |
| 4,566,289 | 1/1986 | Iizuka et al. | 62/228.4 |
| 4,598,764 | 7/1986 | Beckey | 165/242 |

(List continued on next page.)

FOREIGN PATENT DOCUMENTS

| | | |
|---|---|---|
| 3138812 | 4/1983 | (DE) . |
| 4322223 | 1/1995 | (DE) . |
| 0 547351 A2 | 6/1993 | (EP) . |

*Primary Examiner*—Stephen W. Jackson
(74) *Attorney, Agent, or Firm*—Finnegan, Henderson, Farabow, Garrett & Dunner, L.L.P.

(57) ABSTRACT

A two stage reciprocating compressor and associated HVAC systems and methods are disclosed. The reciprocating compressor includes a crankshaft having an eccentric crankpin, a reversible motor for rotating the crankshaft in a forward and a reverse direction, and an eccentric, two position cam rotatably mounted over the crankpin. The crankshaft and cam combine to cause the piston to have a first stroke when the motor operates in the forward direction and a second stroke when the motor operates in the reverse direction. The cam and crankpin also include stabilization means to restrict the relative rotation of the cam about the crankpin. A lubrication system is provided to lubricate the engaging surfaces of the crankshaft and cam and between the cam and the bearing surface of the connecting rod. There is also provided a control for selectively operating the motor either in the forward direction at a first power load or in the reverse direction at a reduced second power load. A protector for the motor is also provided. In addition, the application of the reciprocating compressor to both air conditioning and heat pump systems is disclosed.

13 Claims, 29 Drawing Sheets

U.S. PATENT DOCUMENTS

| | | | |
|---|---|---|---|
| 4,687,982 | 8/1987 | Palaniappan | 318/763 |
| 4,718,247 | 1/1988 | Kobayashi et al. | 62/228.4 |
| 4,767,293 | 8/1988 | Caillat et al. | 418/55.3 |
| 4,838,769 | 6/1989 | Gannaway | 417/312 |
| 4,879,502 | 11/1989 | Endo et al. | 318/723 |
| 4,963,075 | 10/1990 | Albertson et al. | 417/273 |
| 5,070,932 | 12/1991 | Vlasak | 165/240 |
| 5,080,130 | 1/1992 | Terwilliger et al. | 137/512 |
| 5,106,278 | 4/1992 | Terwilliger | 417/547 |
| 5,129,792 | 7/1992 | Abousabha | 417/312 |
| 5,201,640 | 4/1993 | Heinzelmann et al. | 417/312 |
| 5,203,857 | 4/1993 | Terwilliger et al. | 417/552 |
| 5,252,905 | 10/1993 | Wills et al. | 318/807 |
| 5,592,059 | 1/1997 | Archer | 318/254 |
| 5,619,860 | 4/1997 | Yuji et al. | 62/163 |
| 5,780,990 | 7/1998 | Weber | 318/867 |
| 6,217,287 * | 4/2001 | Monk et al. | 417/45 |

* cited by examiner

US 6,331,925 B1

TWO STAGE RECIPROCATING COMPRESSORS AND ASSOCIATED HVAC SYSTEMS AND METHODS

RELATED APPLICATIONS

This is a division of application Ser. No. 09/133,841, filed Aug. 13, 1998; now U.S. Pat. No. 6,132,177 which is a continuation-in-part of Ser. No. 08/911,481, filed Aug. 14, 1997, now U.S. Pat. No. 6,092,993, of which are incorporated herein by reference.

BACKGROUND OF THE INVENTION

1. Field of the Invention

The present invention is directed to a two-stage reciprocating compressor and the it application of such compressors to heating and air conditioning systems and methods. One aspect of the invention is concerned with stabilizing such compressors when the stroke length of one or more reciprocating pistons is switched to change the compressor capacity. Another aspect is the improved throw blocks and lubrication systems for such compressors. Another aspect of the invention concerns a unique electrical circuitry for operating the crankshaft drive motor of the compressor, whereby reversal of the motor for reducing or eliminating the throw takes the motor off the normal run winding and places it on a more efficient winding of reduced current capacity, in particular, the start winding.

Another aspect of the invention is the application of two-stage compressors of the present invention to novel air conditioning and/or heat pump systems and methods. Preferably, such systems include additional two-stage components.

2. Background

The present invention is directed to two stage reciprocating compressors, including scotch yoke compressors such as shown in U.S. Pat. No. 4,838,769. In such machines the reciprocating motion of the pistons is effected by the orbiting of crankpins which are attached to said pistons by connecting rods or other connecting structures having bearings rotatably mounted on said crankpins.

The compressors of the present invention include gas compressors, especially multi-cylinder refrigerant compressors, in which the connecting rod bearing of at least one piston is mounted on an eccentric cam rotatably mounted on the crankpin. This cam angularly adjusts upon reversal of the crankshaft drive motor and the crankshaft to switch to either a lengthened or shortened crankpin throw and piston stroke. Such stroke or throw switching can be engineered to give desired high pressure refrigerant output capacities such that the compressor efficiency can be maintained more easily under varying load requirements.

Throw switching compressors for which the present invention finds particular application are shown and described in U.S. Pat. Nos. 4,479,419; 4,236,874; 4,494,447; 4,245,966; and 4,248,053, the disclosures of which are hereby incorporated herein by reference in their entirety. With respect to these patents the crankpin journal is complex and comprised of an inner and one or more outer eccentrically configured journals, said inner journal being the outer face of the crankpin shaft, and the outer journal(s) being termed "eccentric cams or rings" in these patents, and being rotatably mounted or stacked on said inner journal. The bearing of the connecting rod is rotatably mounted on the outer face of the outermost journal.

In these patents, as in the present invention, all journal and bearing surfaces of the power transmission train of the shiftable throw piston from the crankshaft to the connecting rod are conventionally circular and allow structurally unhindered rotative motion, within design limits, of the outer journal(s) on the inner journal and of the connecting rod bearing on the outermost journal. This rotative motion, in either direction, will, thru the eccentricity of the outer journal surface of the outermost journal relative to its inner bearing surface, shift the radial distance of the orbital axis of the crankpin from the axis of rotation of the crankshaft and thus change the throw of the crankpin and the stroke of the piston.

As described in, e.g., U.S. Pat. No. 4,479,419 and with reference to the structure numbering therein, the angular positioning of the cam 38 on the crankpin 34 is accomplished by providing a pair of drive stops (not numbered in the said U.S. Pat. No. 4,479,419, but numbered 58, 60 in the U.S Pat. No. 4,494,447 as "end points") which are angularly spaced on a portion of the crankshaft such as the crankpin 34, and a driven dog 48 provided on the cam 38. These stops and the dog are angularly positioned with respect to each other such that upon rotation of the crankshaft in one direction one of the stops will first engage one side of the dog and rotate cam 38 to a first prescribed angular position on the crankpin to produce one piston stroke length. Conversely, reversing the rotation of the crankshaft will terminate this first engagement and cause the other of the stops to rotate to and engage an opposite side of the dog and rotate the cam to a second prescribed angular position on the crankpin to produce another piston stoke length. These angular positions are alternatively characterized herein as "end point(s)" or "dog-stop" junction(s) or "contact junction (s)", all hereinafter termed "junction(s)".

It is noted that at least a portion of the rotation of the cam relative to the crankpin to either of its endpoints can also result from the inertia of the cam or the rotational drag of the strap end bearing of the connecting rod acting on the outer journal surface of the cam.

It is apparent that for a given fixed crankpin throw the maximum possible magnitude of the piston stroke shift will depend on the degree of eccentricity between inner bearing surface and the outer journal surface of the cam. A larger eccentricity will allow an increased or reduced throw depending on the angular position of the cam on the crankpin. Therefore, a properly configured eccentricity will allow the said orbital axis of the crankpin to become coincident with the axis of the crankshaft, thus bringing the crankpin throw and the piston stroke to zero, and thus pacifying the throw, piston and cylinder. It is noted that in this zero stroke or passive mode, the completely pacified piston will remain, theoretically, one half way between its normal top dead center and normal bottom dead center positions during further operation of the compressor in the reduced capacity mode.

It is to be particularly noted, that as mentioned above, all of the journals and bearings involved in this power transmission train are essentially perfectly circular within, of course, modern machining capability, and their rotational contacts with one another are practically frictionless. Thus arises the conundrum that if only one side of the dog is in engagement with a stop at any given time, what is to prevent disengagement of the junction and the consequent rotation of the cam on the crankpin during periods when the cam is being driven by the stop with only minimal force? Such a disengagement could produce a plethora of unplanned piston movements or strokes, which could significantly thwart the effort to maintain maximum compressor efficiency under varying load requirements. Based on a review of the above patents, it apparently was believed that the junction can be maintained simply by the inertia of the cam during such periods.

The U.S. Pat. No. 4,494,447 alludes to a destabilizing phenomena, and then only with a glancing mention in column one that gas thrust, piston rod inertia, and centrifugal and gas torque reversal forces contribute to cam instability. In what context and in what relationship however to, e.g., a zero stroke piston mode is not readily apparent from this patent. Also, in column one of that patent it is stated that "—forces which generally tend to prevent the possibility of oscillation are friction forces, various drag loads, and cam inertia forces." This statement appears to be a recitation of those forces which are inherently present, in varying degrees, in all refrigeration compressors, and shed no light on a solution to the instability problem, particularly with respect to a zero piston stroke mode.

This patent then goes on the disclose an actual stabilizing structure constituting its invention, which structure is characterized as aiding in holding the cam in the desired position. This structure comprises end stops 58, 60 which are preferably spaced about 270° apart such that according to the patent a substantial centrifugal force torque "CFT" will develop tending to maintain the stops and dog in contact at the endpoints of the cam rotation, as shown in FIGS. 4 and 5 of the patent. Also as disclosed in this patent, this CFT can be generated by repositioning the center of mass 62 of the cam away from the throw axis which passes thru the crankshaft axis 30a and the crankpin axis 32a, as shown in FIGS. 6 and 7 of the patent.

Applicants have found that with such complex crankpin journals under typical compressor operating conditions, cam inertia alone is ineffective to prevent disengagement, i.e., instability of the junction and the throw shift under the dynamic forces present, even in a theoretically completely pacified cylinder. These compressors have also not been perfected to the extent that they have been used successfully in the marketplace.

In short, while the general concept of two stage compressors is disclosed in the prior art, there exists considerable needs for improvement in these compressors, as to their structure, characteristics, and application in HVAC systems and methods.

SUMMARY OF THE INVENTION

One object of the invention is to provide a crankpin throw shifting structure for at least one crankpin of a multicylinder compressor. The structure overcomes the negative effects of destabilizing forces developed during either the passive or active mode of the piston operation and minimizes or eliminates noise which otherwise would be generated by repeated remakings of the stop—dog junction during operations in either of said modes. Another object is to provide a stabilizing structure whereby in the passive mode the piston has essentially a zero piston stroke. Yet another object is to provide such a stabilizing structure that can be applied with little alteration of the other components of reversible, two stage compressors.

An additional object is to provide improved lubrication systems for the crankpin and eccentric cam assembly of two stage compressors. Another object is to provide an improved assembly of eccentric cams and crankpins for two-stage reciprocating compressors and methods for assembling such compressors.

Still another object is to provide an efficient drive motor reversing system for compressor alternating between full capacity and reduced capacity. Another object is to provide a protector system for the motor control. Yet another object is to provide a motor control that can economically and efficiently operate a number of different two-stage HVAC components, such as compressors, evaporator blowers, condenser fans, and the like.

Further objects of the invention are to apply the two-stage compressor of the present invention to improved air conditioning and/or heat pump systems and methods. Related objects are to provide efficient and economical HVAC systems with two-stage characteristics for a wide variety of refrigerants, including systems that increase the efficient use of R-410.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

To achieve the objects and in accordance with the purpose of the invention, as embodied and broadly described herein, the invention comprises a two stage reciprocating compressor comprising a block having at least one cylinder and an associated compression chamber and piston, a crankshaft including an eccentric crankpin, a reversible motor for rotating that crankshaft in a forward and a reverse direction, and an eccentric, two position cam rotatably mounted over the crankpin. The cam rotates to and operates at a first position relative to said crankpin when the motor is running in the forward direction and rotates to and operates at a second position relative to said crankpin when the motor is running in the reverse direction. The eccentricities of said crankpin and said cam combine to cause the piston to have a first stroke when the motor operates in the forward direction and a second stroke when the motor operates in the reverse direction. The second stroke is less than the first stroke, and in some embodiments is zero. The compressor also includes a control for selectively operating the motor either in the forward direction at a first, preselected, fixed power load or in the reverse direction at a second, preselected, fixed power load. The second power load is less than the respective first power load.

In a preferred embodiment, the motor that runs the compressor is an induction motor having start and run windings. The motor operates in the forward direction on the run winding and in the reverse direction on the start winding. These run and start windings are preferably selected to keep the motor at optimum possible efficiency when operating at both stages. The motor control includes a switching control to switch the operation of the motor from run to start windings, based on known or sensed conditions. This control circuit arrangement provides a single and effective way to provide two-stage operation of a compressor, as well as other HVAC components such as blowers and fans.

The motor and its two stage control are preferably applied to a two stage reciprocating compressor with a two-position eccentric cam that serves to adjust the stroke of at least one piston in the compressor. The compressor preferably includes stabilization means that include a first stop mechanism for restricting the relative rotation of the cam about the crankpin, when the motor is running in the forward direction, and a second stop mechanism for restricting the relative rotation of the cam about the crankpin, when the motor is running in the reverse direction. In one embodiment, the first stop mechanism is in the form of an eccentric mass formed on the eccentric cam, and the second stop mechanism is in the form of a pressure relief system for relieving any significant pressure differential between the low side of the compressor and the compression chamber of the pacified piston.

In addition, the invention comprises a protection for the motor. The protected motor comprises a single phase reversible induction motor having start and run windings and designed to operate on the run windings when rotating in one direction and on the start windings when rotating in the second direction. The motor circuiting includes a protector having an enclosure holding a heat sensitive switch and a pair of heaters. The heaters, preferably in the form of resistors, are connected to the heat sensitive switch at one end and respectively to the start and run windings of the motor at the other end. When the internal temperature of the protector reaches a preselected temperature, the heat sensitive switch operates to open the circuit and remove the windings from power for a preselected period of time. Preferably, the motor is applied to run a two stage reversible motor, and the protector and motor are encased in the compressor housing.

Another aspect of the invention is a crankshaft and cam assembly for a variable load compressor having at least one cylinder and an associated piston driven by the combination of a crankpin and an eccentric cam on the crankpin. The crankshaft comprises a shaft with a proximal end and a distal end with at least one eccentric crankpin formed between the proximal and distal ends. Stops are formed on or adjacent the crankpin at a pair of angularly separate points. The eccentric cam rides on the crankpin and has a diameter equal to or larger than the diameter of the crankshaft at its distal end. The cam includes a pair of dogs for selective engagement with the stops on the crankpin. The system includes a mechanical system for holding the cam in its axial position on the crankpin, when the two are assembled.

In one embodiment the mechanical system includes an end cap fixed to the shaft. In other embodiments, the mechanical system includes a radial hole formed in the crankpin and a pin that extends into the radial hole of the crankpin and slides within the internal slot. Additional embodiments are described below.

Another aspect of the invention is a lubrication system for applying lubricant to the engaging surfaces of the crankshaft and cam and between the cam and the bearing surface of the connecting rod of the two stage compressor of the present invention. In one embodiment the lubricating system includes an elongated axial supply formed in the crankshaft, a cross drill formed in the crankshaft and in fluid communication with the axial supply and an outer surface of the crankpin, and an oil communication hole formed in the cam. The oil communication hole is aligned with the radial cross drill in the crankshaft, when the cam is in both the first and second positions, and is in fluid communication with the bearing surface of the connecting rod in both positions. Other embodiments of the lubricating system are contemplated and described below.

The invention further comprises the application of a two stage compressor, particularly the two stage compressor of the present invention to air conditioning systems and methods. The invention thus includes a system for cooling a space comprising a two stage compressor that operates either at a first fixed maximum load or at a reduced second load, an expansion device, an evaporator, and a condenser, in a refrigeration loop with the compressor. The system also includes a two stage evaporator blower that operates either at a first fixed maximum load or at a second reduced fixed power load. The air conditioning system also includes a control system interconnected with the compressor and blower and designed to operate the compressor and blower at the respective first stages when the cooling requirement exceed a preselected value and at the respective second stages when the cooling requirements fall below that preselected value.

Preferably, the first and second stages of the compressor and the blower are matched to provide optimum efficiency for the cooling requirements of the system. The compressor of the system preferably is a reversible two stage reciprocating compressor of the present invention. The control preferably is provided by a two stage thermostat, and the expansion valve preferably is a two stage device. The cooling system of the present invention can be used with the wide variety of refrigerants and applies R-410 refrigerant more efficiently than conventional systems.

In addition, the invention includes the application of two stage compressors to heat pump systems and methods. The invention thus includes a heat pump system comprising a two-stage compressor, condenser, an expansion device, an evaporator, and means for operating the compressor, condenser, expansion device, and an evaporator as a heat pump that can selectively provide air conditioning and heating, as required. The system includes a control system for operating the system in a heating mode with the compressor running at the first stage or the second stage, based upon the heating requirements, and for operating the system in an air conditioning mode with the compressor running only at the first stage. The heat pump system preferably has a single orifice expansion valve, and the compressor preferably operates at 60% to 70% capacity in the air conditioning mode. Preferably, the two stage reversible compressor of the present invention is applied to this system.

It is to be understood that both the foregoing general description and the following detailed description are exemplary and explanatory only and are not restrictive of the invention, as claimed.

The accompanying drawings, which are incorporated in and constitute a part of this specification, illustrate one (several) embodiment(s) of the invention and together with the description, serve to explain the principles of the invention.

DETAILED DESCRIPTION OF THE DRAWINGS

Figure 1:
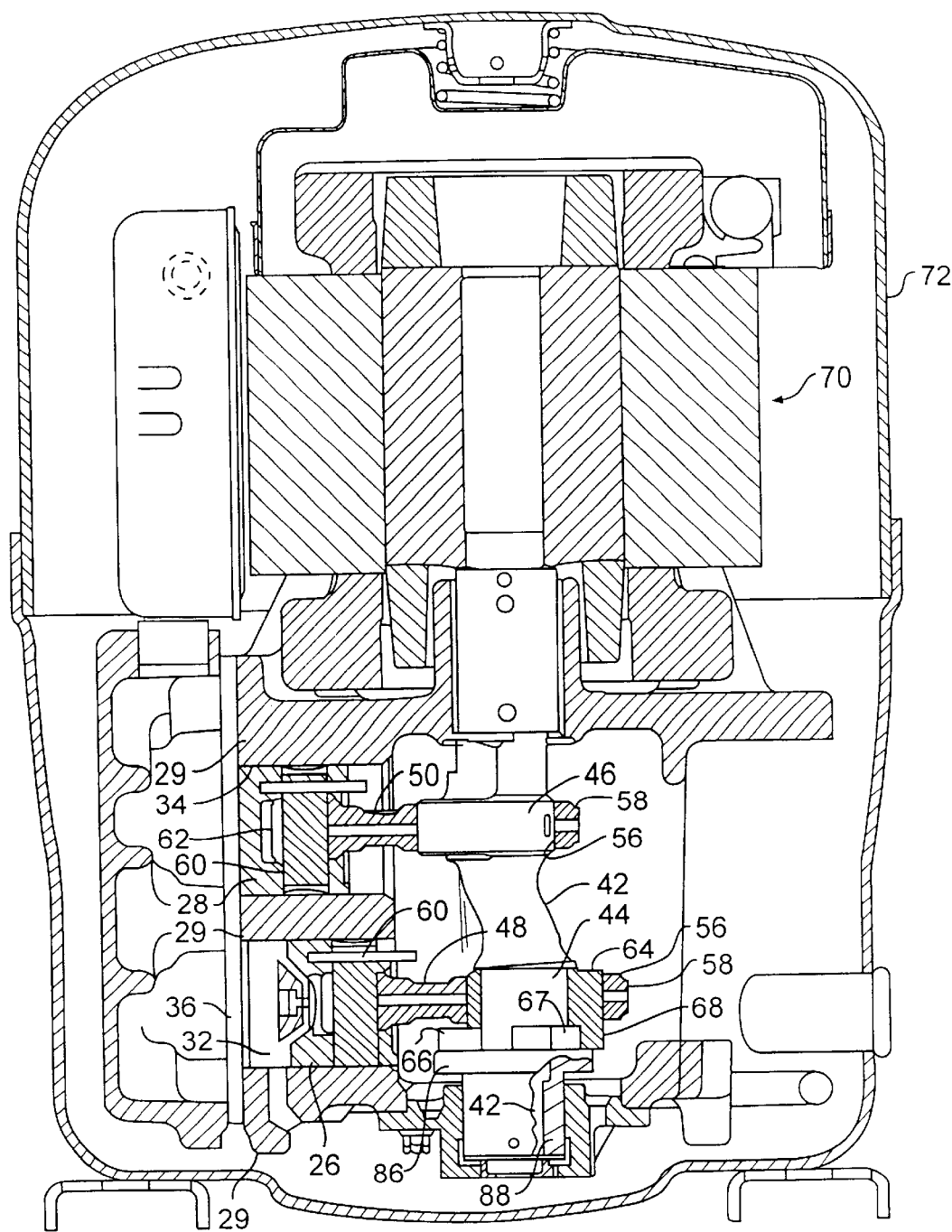
FIG. 1 is a longitudinal, vertical cross-sectional view of a refrigerant compressor with portions shown in relief for purposes of clarity, and with its bottom crankpin throw modified with an eccentric cam in accordance with the present invention, with the cam shown in its active mode orientation, i.e., full throw of the crankpin, and with the associated piston having a pressure deformable suction valve structure in the piston head, whereby said structure provides for pressure letdown from the compression chamber.
Figure 2:
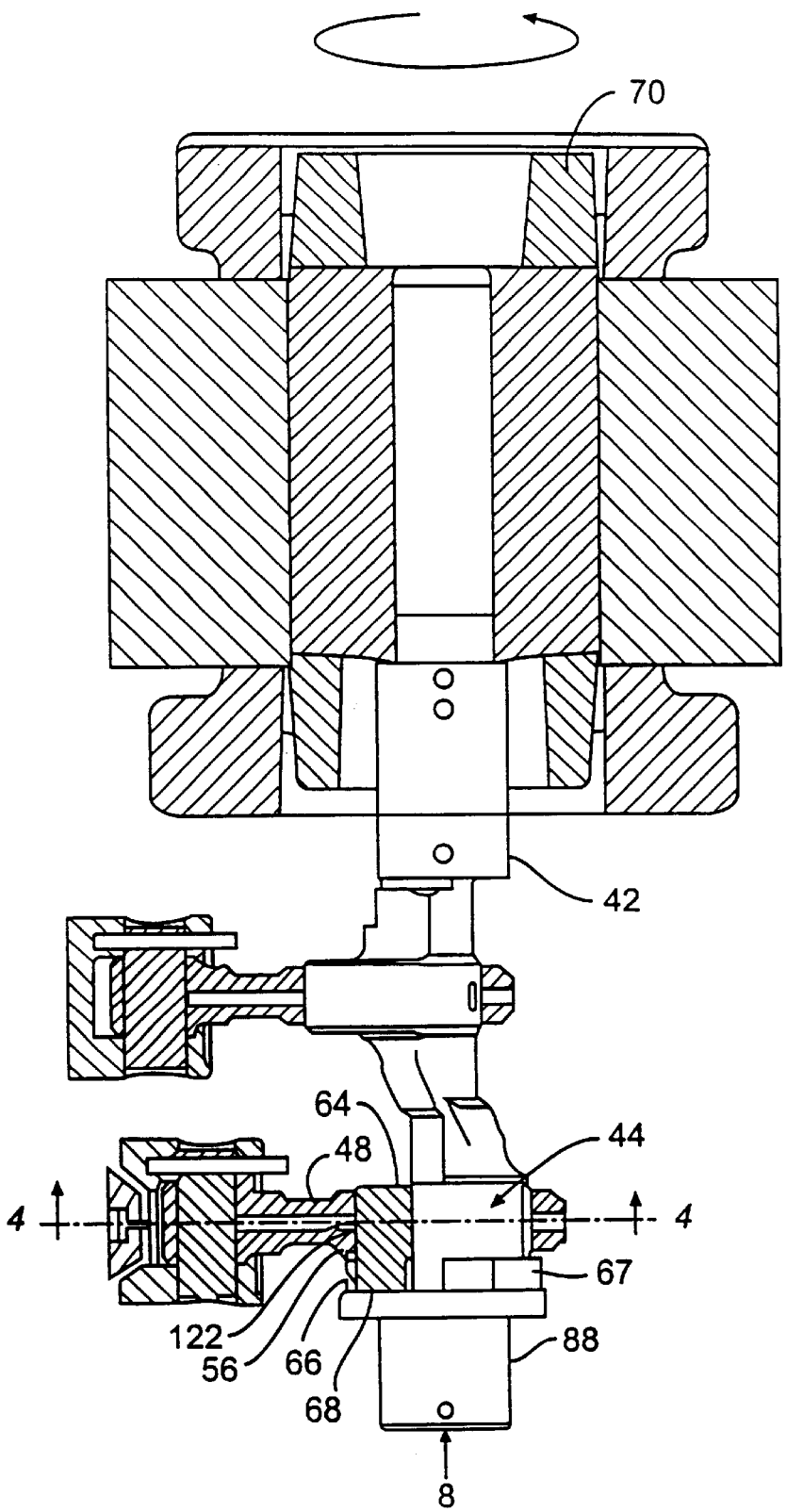
FIG. 2 is a cross-sectional view of the bottom piston and crankshaft throw area as in FIG. 1 and showing the cam in its passive mode orientation wherein the apex of the cam is proximal to its associated piston, i.e., producing a zero crankpin throw.

Reference will now be made in detail to the present preferred embodiments of the invention, examples of which are illustrated in the accompanying drawings. Wherever possible, the same reference numbers will be used throughout the drawings to refer to the same or like parts.

The present invention is directed to improved two stage, reversible reciprocating compressors and the application of such compressors to heating and air conditioning ("HVAC") systems. The compressors include at least one eccentric cam that alters the stroke of at least one piston, when the motor rotation is reversed. Such compressors can include a single compression chamber and piston, or multiple compression chambers and pistons. If the compressor is a single piston compressor, the piston operates at full stroke in one direction and a reduced stroke (e.g. half stroke) in the reverse direction.

The maximum strokes of different pistons in a multi-piston cylinder can be the same, or can be varied to provide optimum results for a given application. The minimum stroke of piston driven by eccentric, two position cams can vary from zero to a stroke length only slightly less than the maximum. The desired stroke lengths are achieved by the eccentricities of the crankshaft, or the combination of crankshaft and cam, driving the respective pistons, and these lengths are related to provide the optimum output for a given application. By means of example only, the compressor can have two compression chambers and pistons, only one piston having a variable stroke achieved by the use of an eccentric piston. In such a compressor, the piston driven by the cam can be designed to have a zero stroke when the cam is in the second position, or it can have a shortened stroke in a compressor with two pistons, that compressor can be designed so that the pistons have equal strokes and full capacity and one piston has no stroke at partial capacity achieved by reversal of the motor. This can be achieved, for example, by designing the eccentric cam to rotate 180° so that is centerline is in line withe that of the crankshaft, thus neutralizing one of the pistons. Such a compressor would have 100% and 50% output. A similar two piston compressor could be designed to have a 100% and 40% output, by designing one piston to provide 40% of the output and reducing the stroke of the other 60% piston to zero, when the motor is reduced. A wide variety of similar options are available to provide a compressor having the load characteristics that match the particular application.

In yet another embodiment, the compressor may have three or four compression chambers and pistons, only one or two of which are driven by an eccentric cam. As a result, compressors having a wide variety of load characteristics can be designed to meet particular applications.

One exemplary embodiment of the present invention is illustrated in the drawings. This particular variable capacity gas compressor has dual in-line pistons 26, 28. The compressor includes a cylinder block 29 formed with cylinders 32, 34 in which pistons 26, 28 respectively are reciprocally mounted. The compressor includes a valve plate 36 in which suction valve 38 and discharge valve 40 typically are provided. It is noted however, that where the suction valve is mounted in the piston head as in U.S. Pat. Nos. 5,080,130; 5,106,278; and 5,203,857, the disclosures of which are hereby incorporated herein by reference in their entirety, no suction valve is needed in the valve plate.

Figure 4:
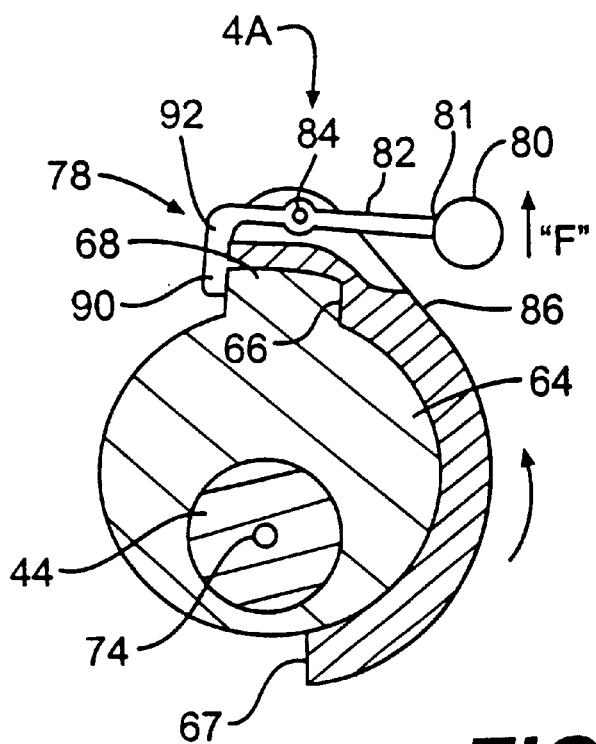
FIG. 4 is a cross-sectional view taken along line 4—4 of FIG. 2 showing a centrifugal force operable latching mechanism.

A crankshaft 42 is rotatably mounted on block and is provided with crankpin shafts or eccentrics 44, 46. Connecting rods 48, 50 are each provided with a bearing 56 on one end portion 58, and with a wrist pin 60 on its other end portion 62. An eccentric cam 64 is rotatably mounted on at least one of said crankpins, and one of said bearings 56 is rotatably mounted on the cam. In one embodiment, as shown in FIG. 4, drive stop 66 and 67 are provided on the crankshaft at predesigned angular positions thereon, and one driven dog 68 is provided on the cam at a predesigned angular position thereon.

It is noted that either two stops can be provided with one dog positioned therebetween, or two dogs can be provided with one stop positioned therebetween. Either way the stop(s) and dog(s) define the angular limits or end points of rotatability of the cam on the crankpin.

A reversible motor 70 within the compressor shell 72 drives the crankshaft selectively in either rotational direction in accordance with operational electrical signals transmitted thereto, and the cam is responsively rotatable to one said end point upon rotation of said crankshaft in one direction and to the other point upon rotation of said crankshaft in the reverse direction, at which end points the stop(s) and dog(s) form the junction(s).

Stabilizing Mechanisms and Systems

In reversible two stage compressors of the above type, complex phenomena cam cause the junctions between the stops and dogs to disengage during operating conditions. Such disengagement adversely affects the reliability and usefulness of the compressors.

For example, applicants have discovered in the particular case wherein the cam has been rotated on the crankpin to produce a zero piston stroke, any significant "incidental" pressure above ambient (i.e., above the low pressure side of the compressor) developed in the pacified compression chamber will act on the piston and connecting rod and cause the cam to rotate on the crankpin at least within the first quadrant (see FIG. 3) and disengage the junction. Such pressure can be introduced in the inactive cylinder through high pressure leakage across the discharge valve or upon compressor start up in the pacified mode. Pressure can also be built up by moving the piston from the bottom dead center to mid stroke, thereby reducing the volume in the inactive cylinder to half and producing enough pressure to cause disengagement.

Such disengagement can range rapidly from barely detectable to several degrees and can result in the generation of unwanted piston strokes of various lengths. Applicants have also found that a further problem resulting from such disengagement is that of the generation of considerable metallic clacking or clicking noise generated by the rapid and forceful reengagement of the stop and dog, particularly in the second quadrant, as the disengagement angle declines to zero with a drop in said incidental pressure towards or even below ambient.

Further, taking the case where a previously completely pacified piston has become fully stroked by reversal of the crankshaft rotation, applicants have found that incidental pressure applied to the piston on the inception of its suction stroke by way of compressed gas which was not discharged on the compression stroke, i.e., reexpansion gas, will tend to cause an essentially immediate disengagement of the junction in the first quadrant. This disengagement can then be continued and perhaps amplified in the second quadrant as the linear velocity of the crankpin declines for the bottom dead center turn while the linear inertia of the combined masses of the piston and connecting rod maintains a rotating force on the cam and tends to advance it and the dog further beyond the stop. Under such conditions, the eventual reengagement of the stop and dog in a late section of the second quadrant is with substantial momentum and impact.

Another major contributor to junction instability found by applicants is that immediately upon completion of the bottom dead center turn of the crankpin, the diminished pressure existing in the compression chamber will allow the ambient pressure to rapidly force the piston further into the cylinder and thereby rotate the cam in advance of the stop and cause a substantial degree of disengagement. Then, as the pressure in the compression chamber rapidly increases on the compression stroke, the linear velocity of the piston rapidly declines relative to the orbital velocity of the crankpin and the stop catches up with and impacts against the dog, with considerable force and noise.

The present invention includes a stabilizing structure for throw adjusting eccentric cams, wherein the mechanism for positioning the cam at opposite end points comprises cooperating drive stop means on the crankshaft and driven dog means on the cam. The stabilizing structure comprises at least one of:

(A) positive lock means selective from the group consisting of
   (a) latching means having cooperating elements on said crankshaft and cam, said elements being engageable and disengageable at least at one of said end points by the application of or the release of, respectively, centrifugal force applied to an element of said latching means, or
   (b) pressure differential operable means having cooperating elements on said crankshaft and cam, said elements being engageable and disengageable by sudden and opposite angular motion respectively between said crankpin shaft and cam at least at one of said end points;
(B) friction drag means having operating elements on said cam and said crankshaft and being engageable to resist destabilizing forces tending to rotate said cam on said crankpin shaft and thus separating said junction at least at one of said endpoints; or
(C) pressure regulating means which functions to minimize any differential in pressure between the low side of the compressor and the compression chamber of a pacified cylinder.

It is noted that for certain compressor operating conditions it may not be considered necessary to provide a stabilizing structure for each of the junctions, i.e., at both of said endpoints, although providing at least one of said structures for each end point is highly preferred.

Figure 5:
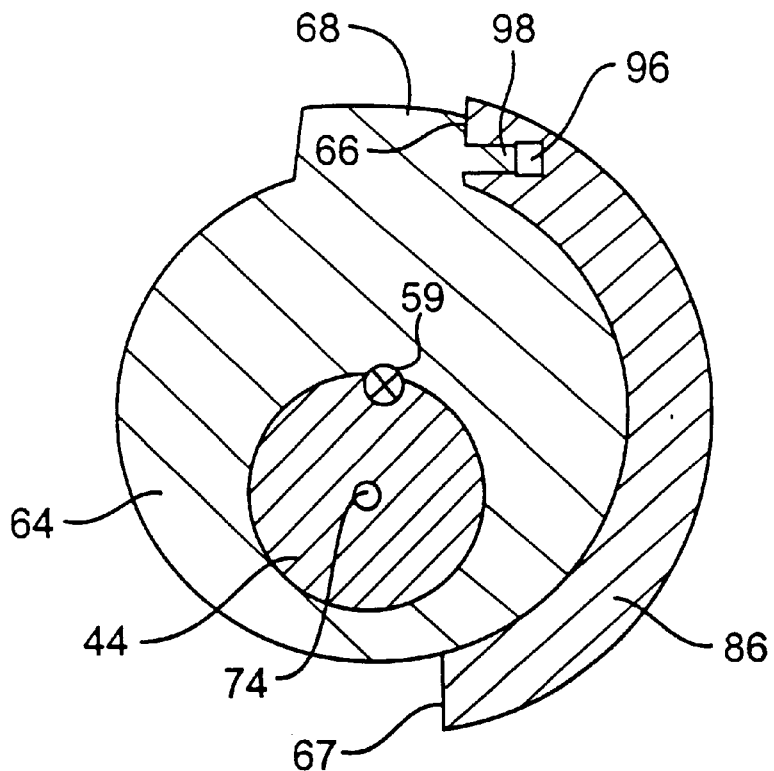
FIG. 5 is a cross-sectional view showing a pressure differential operated stabilizing structure.
Figure 6:
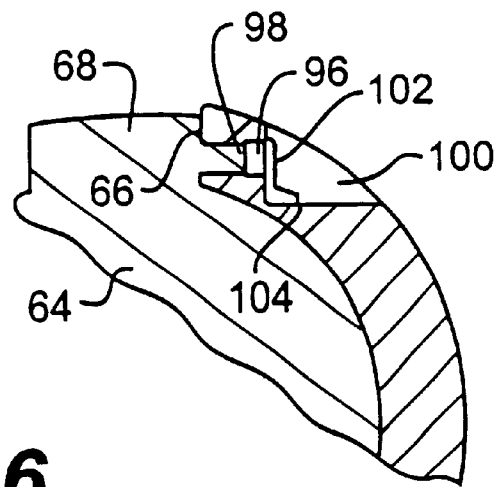
FIG. 6 is a view showing a variation of the structure of FIG. 5.

The present stabilizing means designated above as being at least one of (A), (B) or (C) are further and more specifically explained with reference to the drawings wherein FIGS. 4–6 show exemplary embodiments of (A), FIGS. 7–11 show exemplary embodiments of (B), and FIGS. 12–21 show exemplary embodiments of (C).

Figure 3:
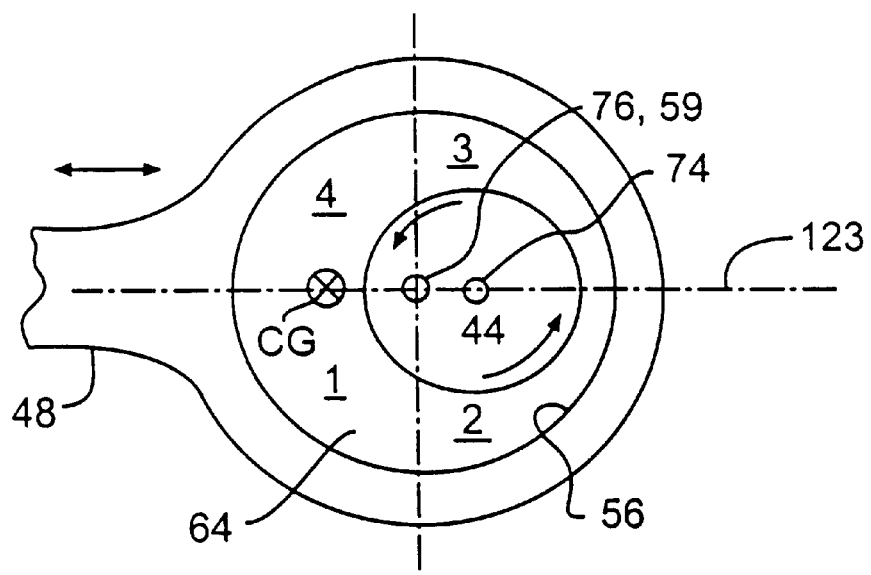
FIG. 3 is a geometric illustration of the passive throw cycle with reference to the structure of FIG. 2, taken in a counterclockwise crankshaft along line 8, with the quadrants of the cycle numbered progressively 1–4 and with the piston at its passive position as in FIG. 2.

Referring to FIG. 3, the cam 64 is shown in its pacifying orientation wherein the center axis 74 of the crankpin shaft 44 has been translated to the rotational axis 76 of the crankshaft and the center or rotational axis 59 of the cam whereby the orbital axis of the crankpin has become aligned with the rotational axis of the crankshaft. This translation has, in effect, reconfigured the crankpin to be concentric with the crankshaft, the reformed crankpin now constituting the total mass and shape of the original crankpin shaft plus that of the cam. As seen in FIG. 3, each revolution or orbit of the crankpin is quartered into four quadrants 1–4, for purposes of clarity in regard to the aforementioned destabilizing forces and the stabilizing structures detailed below.

Figure 4A:
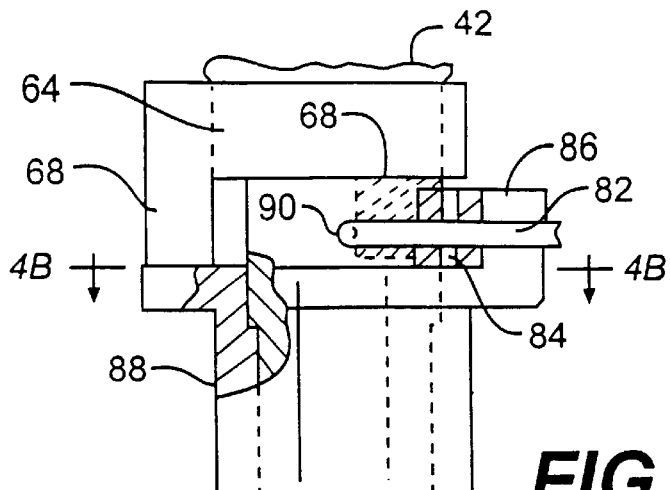
FIG. 4A is a view of the mechanism of FIG. 4 as viewed from the top side in the direction of line 4A.
Figure 4B:
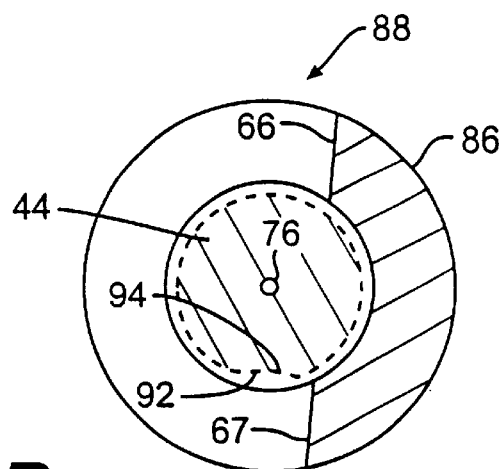
FIG. 4B is a view taken along line 4B—4B of FIG. 4A.

Referring to FIG. 4, 4A and 4B, one preferred structure for the latching means generally designated 78 comprises a mass 80, e.g., 5–10 ounces or so, on the distal end 81 of a lever 82 which is pivotally connected by a pivot pin 84 to a portion of the crankshaft such as e.g., skirt portion 86 of a bushing 88, which portion carries the dog or dogs. A hook member 90 is formed on the proximal end of the lever and engages the dog 68 as a dog engages stop 66, in response to upward centrifugal force "F" (as viewed in FIG. 4) on mass 80 developed by the rotating crankshaft.

It is noted that as the crankshaft slows down to reverse its rotation, the weight of mass 80 will overcome the centrifugal latching force "F" and pivot member 90 out of engagement with dog 68 to allow rotation of the cam to its other end point at stop 67. This delatching will occur most easily when the crankshaft, cam and lever structure as shown in FIG. 4 are in substantially their vertical orientation as shown in FIG. 4.

An identical device 78 may be mounted on the bushing skirt 86 adjacent stop 67 to maintain the dog 68 stop 67 junction in the same manner as described above. Bushing 88 is keyed to the crankshaft by cooperating flats 92 and 94 on the crankshaft and the bushing 88 respectively. Keys and keyways may of course be employed alternatively for this purpose.

Figure 4C:
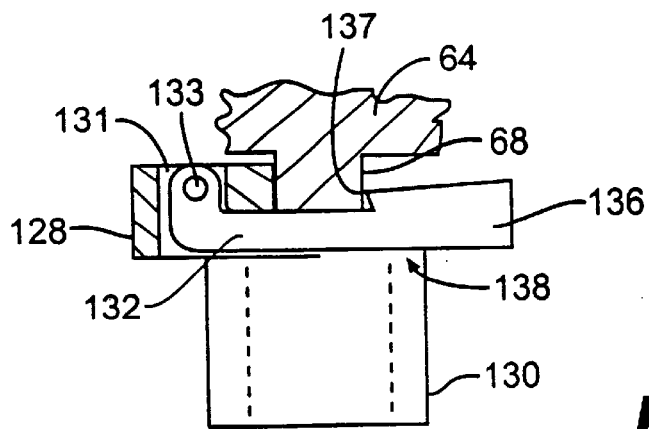
FIG. 4C is a side view of a preferred construction and configuration of the type of stabilizing means of FIG. 4 in its latching or running mode.
Figure 4D:
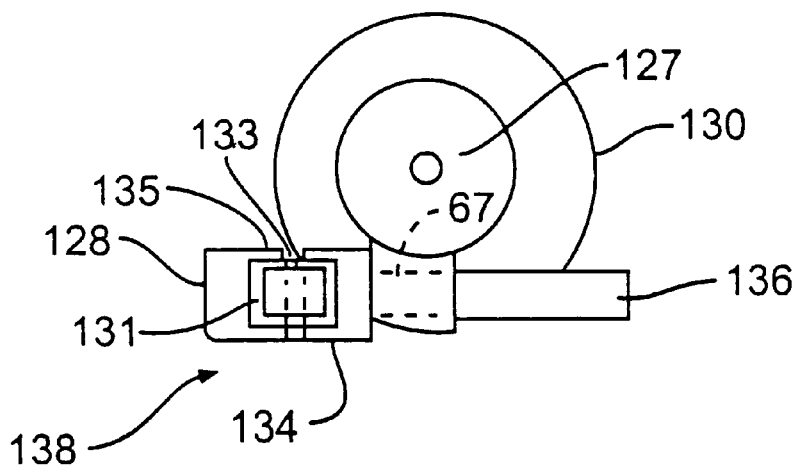
FIG. 4D is a top view of the stabilizing means of FIG. 4C.
Figure 4E:
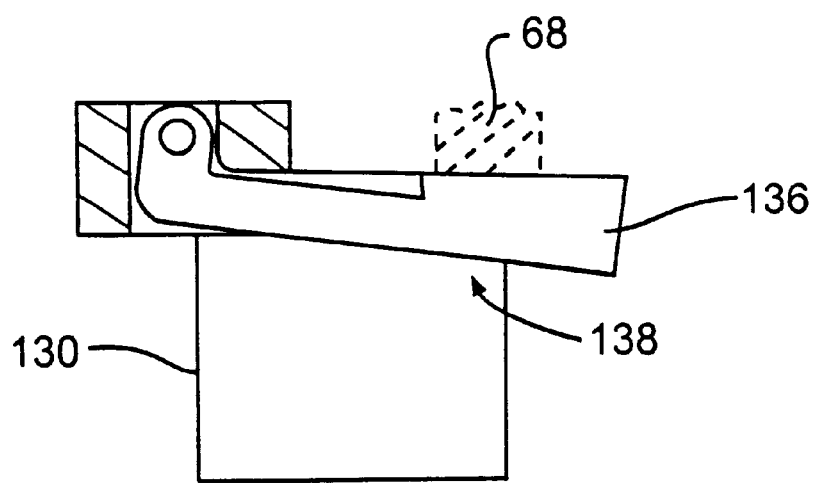
FIG. 4E is a side view of the stabilizing means of FIG. 4C in its unlatched or stopped mode.
Figure 25:
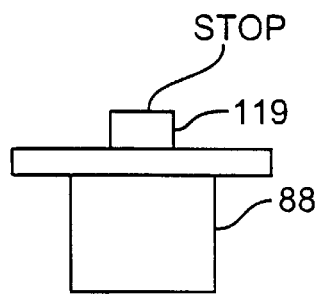
FIG. 25 is a side view of a single dog bushing for use with the cam of FIG. 22.
Figure 26:
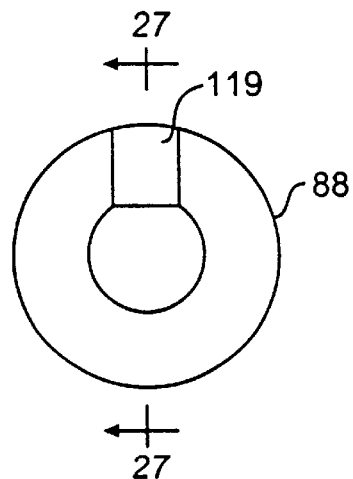
FIG. 26 is a top view of the bushing of FIG. 25.
Figure 27:
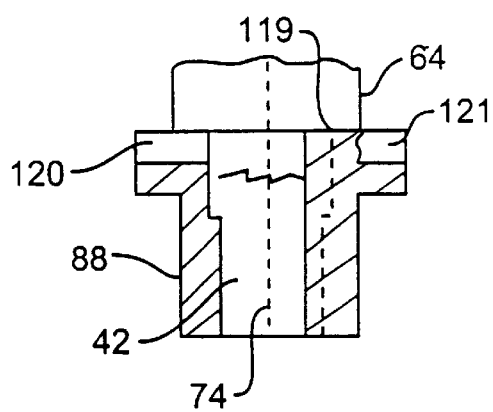
FIG. 27 is a partially cross-sectional view taken along line 27—27 of FIG. 26, an assembly of the cam of FIG. 22 and the bushing of FIG. 25 onto the lower end of the crankshaft.

Referring to FIGS. 4C, 4D and 4E, the modification of bushing 88 as shown as 130 in FIGS. 4C–4E is rotated 180° on its bore axis 127 from 88 of FIGS. 25–27, and is provided at its upper end with a stabilizing means 138 comprising a boss generally designated 138 having a channel opening 131 in which a latching arm 132 is pivotally mounted on a pivotal axis in 133 affixed thru the sides 134, 135 of the boss. Arm 132 extends generally laterally of the bushing and is formed with a mass 136. A shoulder 137 is provided on the arm for engaging a dog such as 68 shown in FIG. 4 when the crankshaft is rotated, and the centrifugal force thus produced moves arm 132 upwardly from its non-latching position of FIG. 4E. In this embodiment, another such stabilizing means 138 may be provided on the opposite top portion of the bushing to also stabilize the junction(s) at the end point.

Referring to FIG. 5 the stabilizing structure comprises a close mating cavity 96 and plunger 98. During compressor operation, cavity 96 is typically flooded with compressor oil, and when the dog-stop junction is formed, an oil seal exists around plunger 98. Thus when a destabilizing force acts on the cam tending to pull the plunger from the cavity, a pressure differential is developed across the plunger tending to force it back into the cavity. When, however, motor reversal occurs, the initial inertia of the cam and the acceleration of the crankshaft suffice to pull the plunger from the cavity and disrupt the junction.

Referring to FIG. 6, the stabilizing structure of FIG. 5 may be modified by opening the inner end of cavity 96 to ambient crankcase conditions by cut-out 100 and by affixing a check valve such as the thin, highly flexible flap valve 102 to the skirt by pin 104 or the like. This valve, which is flexibly biased toward its closed position, allows plunger 98 to easily insert into cavity 96 during the junction making by springing open in response to small hydraulic force, but when closed maintains said pressure differential and prevents inopportune withdrawal of the plunger.

Figure 7:
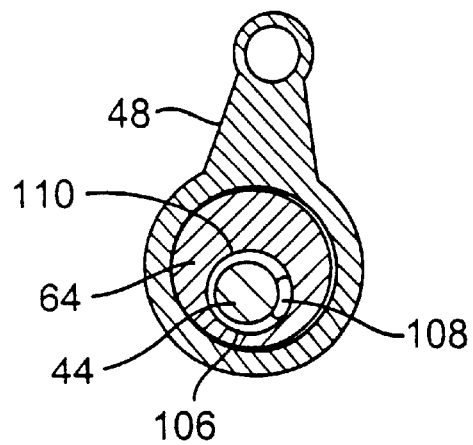
FIG. 7 is a cross-sectional view taken along line 4—4 of FIG. 2 and showing the crankpin journal surface provided with a groove and o-ring in sliding contact with the cam bearing surface.

In FIG. 7, the stabilizing structure comprises an o-ring 106 secured in an annular groove 108 in the crankpin shaft journal surface and frictionally engaging the bearing surface 110 of the cam. This o-ring can be dimensioned with respect to the journal and cam to provide a drag which cannot be readily overcome by most of the destabilizing forces.

Figure 8:
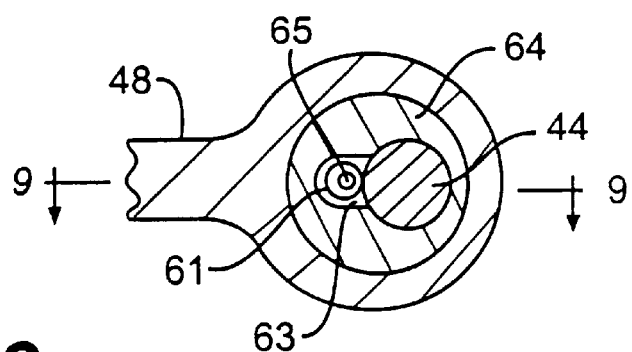
FIG. 8 is a cross-sectional view of the bearing-journal area taken along line 4—4 of FIG. 2 in the direction of the arrows and showing a mechanical means, i.e., a pressure roller for developing friction drag and tending to maintain said junction(s)
Figure 9:
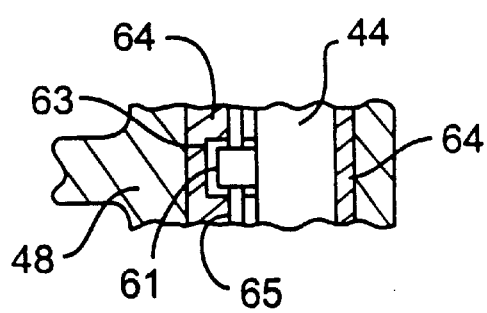
FIG. 9 is a cross-sectional view taken along line 9—9 of FIG. 8 further showing the mountings for the roller of FIG. 13.

Referring to FIGS. 8 and 9, the frictional drag is provided by a roller 61, preferably of semi-hard plastic such as Nylon, Teflon, or the like, rotatably mounted in a recess 63 formed in the body of cam 64, by shaft 65. This roller also may be dimensioned to provide practically any desired stabilizing force.

Figure 10:
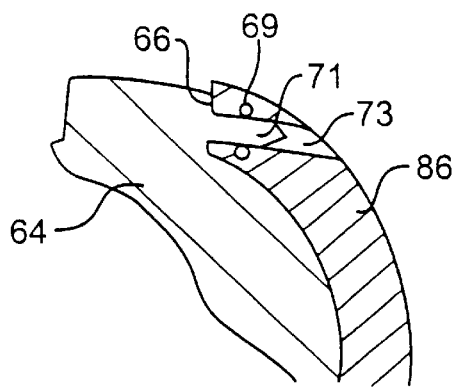
FIG. 10 is a view as in FIG. 5 showing a friction drag stabilizing structure.

In FIG. 10 a variation of the pressure differential stabilizing structure of FIG. 5 is shown, and provides a desired friction drag by means of an O-ring 69 frictionally surrounding a plunger 71 in a thru bore 73 provided in skirt 86.

Figure 11:
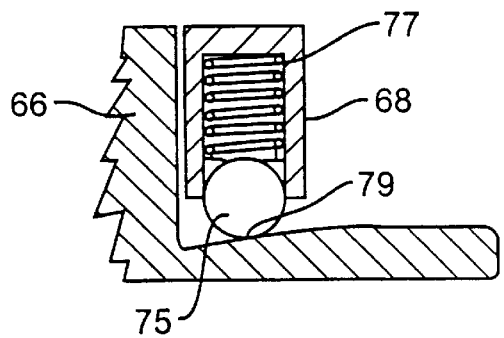
FIG. 11 is a variation of the friction drag means.

In FIG. 11 the frictional drag is provided by means of a ball 75 and compression spring 77 mounted on dog 68 and wherein a ramp 79 is provided on the crankshaft adjacent the stop. As the junction is made, the ball is crammed or forced down the ramp 79 towards the stop by the action of the ramp and spring. This cramming force maintains the junction against at least some of the destabilizing forces.

It is particularly noted that all of the embodiments of the stabilizing structure of FIGS. 4–11 can also be employed to stabilize the junction at stop 67. Also, should it be desirable for a particular compressor, the stops 66, 67 may be angularly displaced at more or less than the approximate 180° as shown since these stabilizing structures are operable for any angular displacement.

Referring to FIGS. 12–22, FIGS. 32–34, and FIGS. 39–40, stabilizing structures are shown that help regulate the pressures in the compression chambers of active cylinders as well as in completely pacified or partially pacified cylinders. These and other structures that fall within the scope and spirit of the disclosure and claims fall within the present invention.

Figure 12:
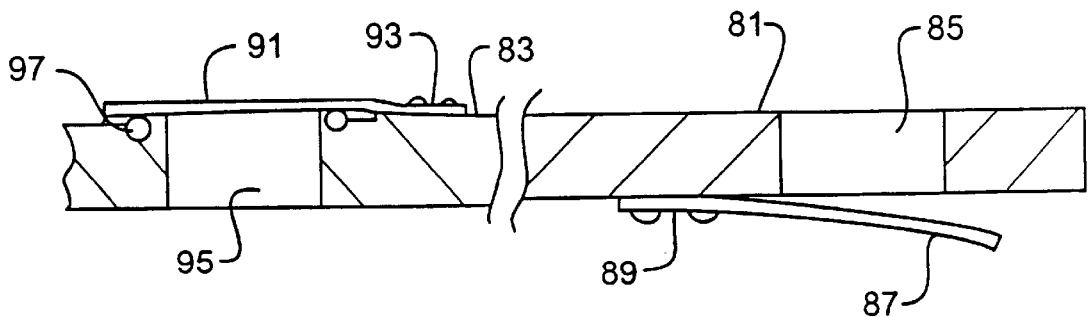
FIG. 12 is a cross-sectional view of a portion of the valve plate of FIG. 1 showing a sprung reed-type suction valve and special discharge valve.

In FIG. 12 is shown a valve plate having a suction section 81 and a discharge section 83. In the suction section having suction port 85, a reed-type suction valve 87 is shown affixed at one end 89 to the plate in known manner. This valve is lightly sprung to an open position as shown, whereby when the piston is in a completely pacified condition, any high pressure refrigerant leakage past the discharge valve into the compression chamber which could present a destabilizing force will be let down into the low pressure section of the compressor thru the suction valve. This suction valve is sprung open with only a light force, e.g., 5–10 ounces, such that it will close readily upon reactivation of the cylinder.

In FIG. 12, a discharge valve 91 is affixed to the plate at one end 93 and functions to seal and open discharge port 95. This particular discharge valve is designed to be essentially non-leading by virtue of an O-ring 97 mounted in an annular groove formed in the valve plate and surrounding the discharge port. Such a valve greatly assists in diminishing the development of incidental pressure in the compression chamber of a completely pacified cylinder.

Figure 13:
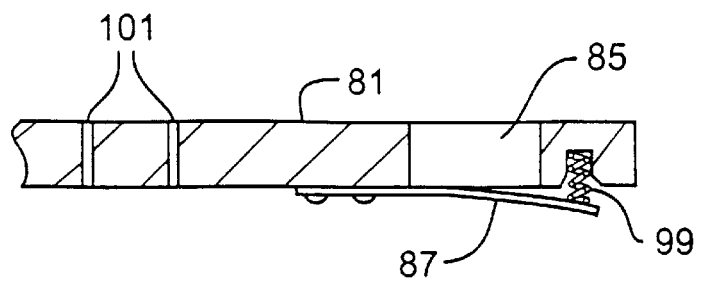
FIG. 13 is a view as in FIG. 12 showing the use of a positive pressure applicator means for resiliently urging a normally closed reed valve to slightly open position and showing pressure let down apertures thru the suction of the valve plate.

In FIG. 13, the valve 87 is shown biased to an open position by means of a very light compression spring 99 mounted in the plate. Also shown in this figure are alternative or complementary stabilizing means, particularly for a pacified cylinder, of one or more small bleed apertures 101, e.g., 10–20 microns in diameter, formed in the suction section of the valve plate and communicating with the low side of the compressor.

Figure 14:
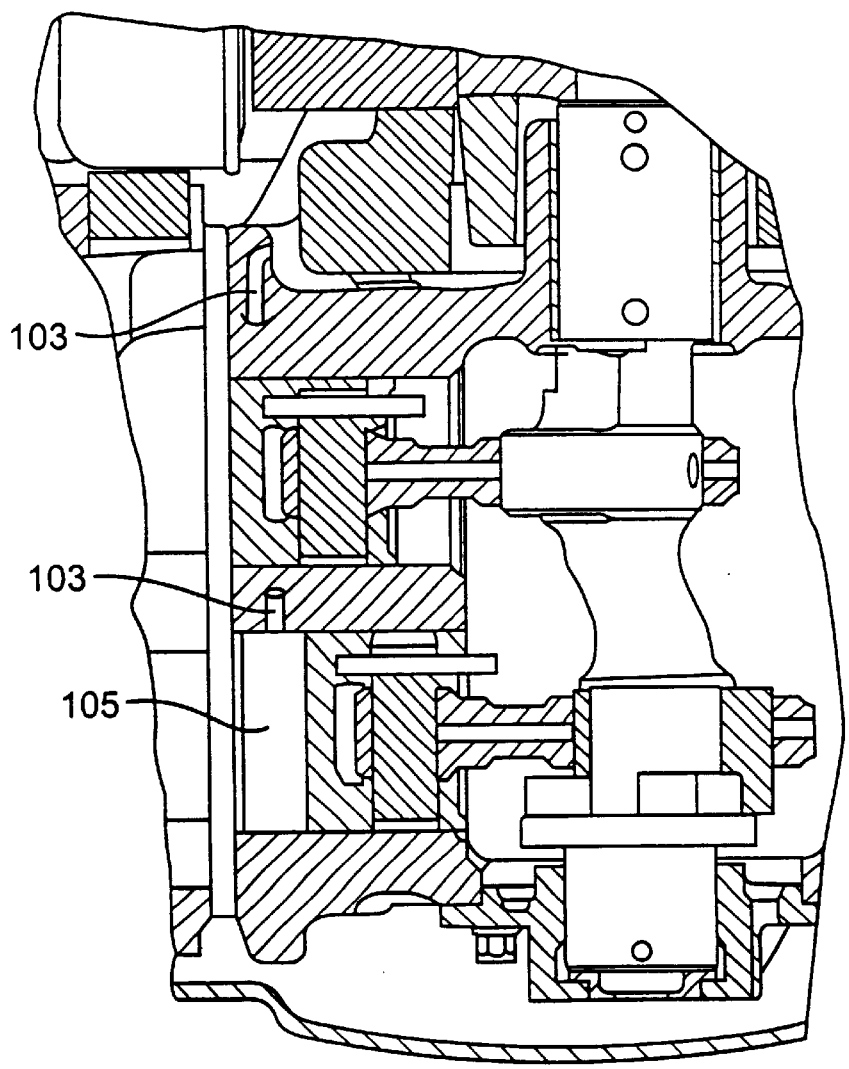
FIG. 14 is a view as in FIG. 1 of a portion of the compressor showing a pressure let-down aperture formed thru the cylinder wall and communicating thru conduit means provided in the cylinder block with the low pressure side of the compressor at a location removed from the dense gas-oil area of the crankcase.

In FIG. 14, a pressure let-down conduit or passage 103 is provided either externally of the block or formed internally therethrough as indicated, which communicates with the compression chamber 105 and extends upwardly to an outlet communicating with the low side at the position removed from the heavy oil-refrigerant mix. Such a vent hole or holes formed in the cylinder wall define gas flow characteristics and provide a pressure release, as explained in more detail below.

Figure 39:
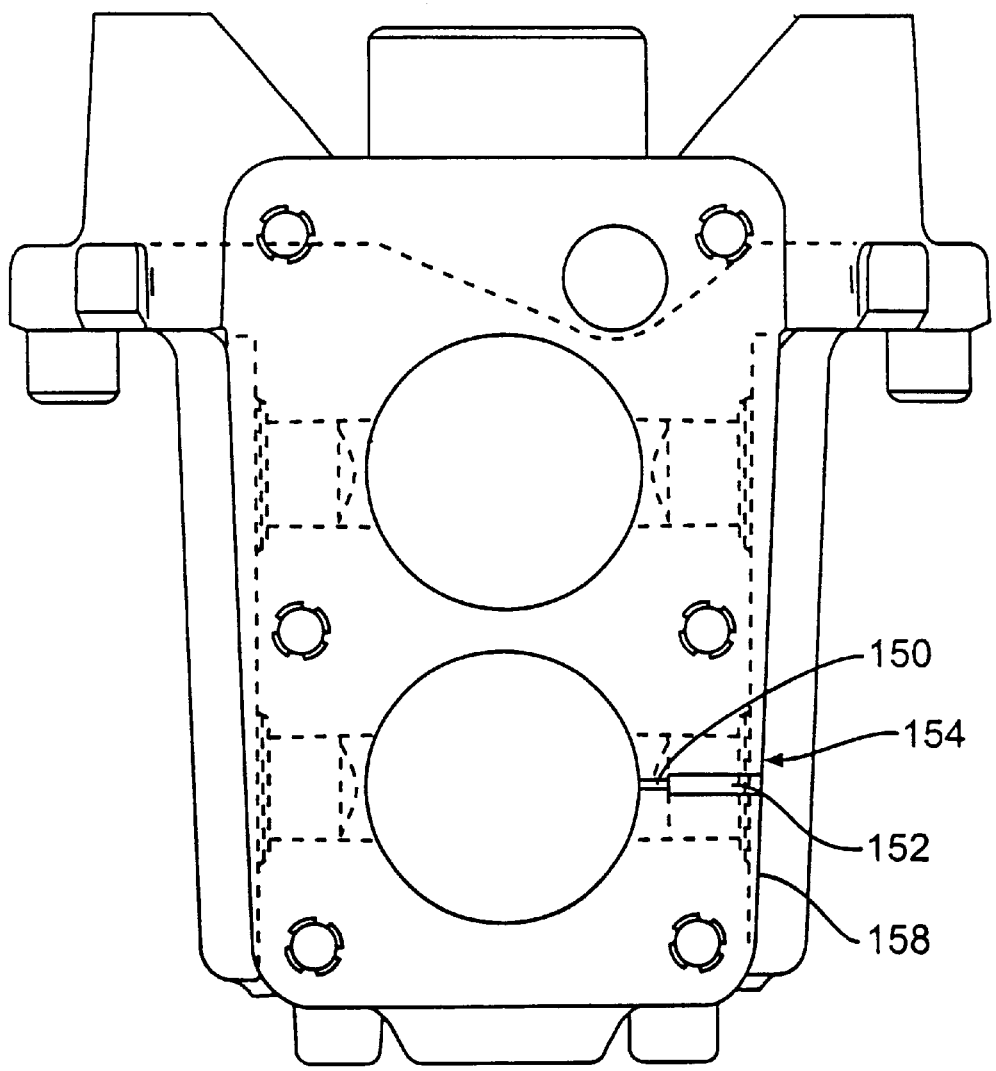
FIG. 39 is a partially sectioned view of a two cylinder compressor as viewed toward the top of the cylinders. i.e., toward the side or head of a typical compressor.
Figure 40:
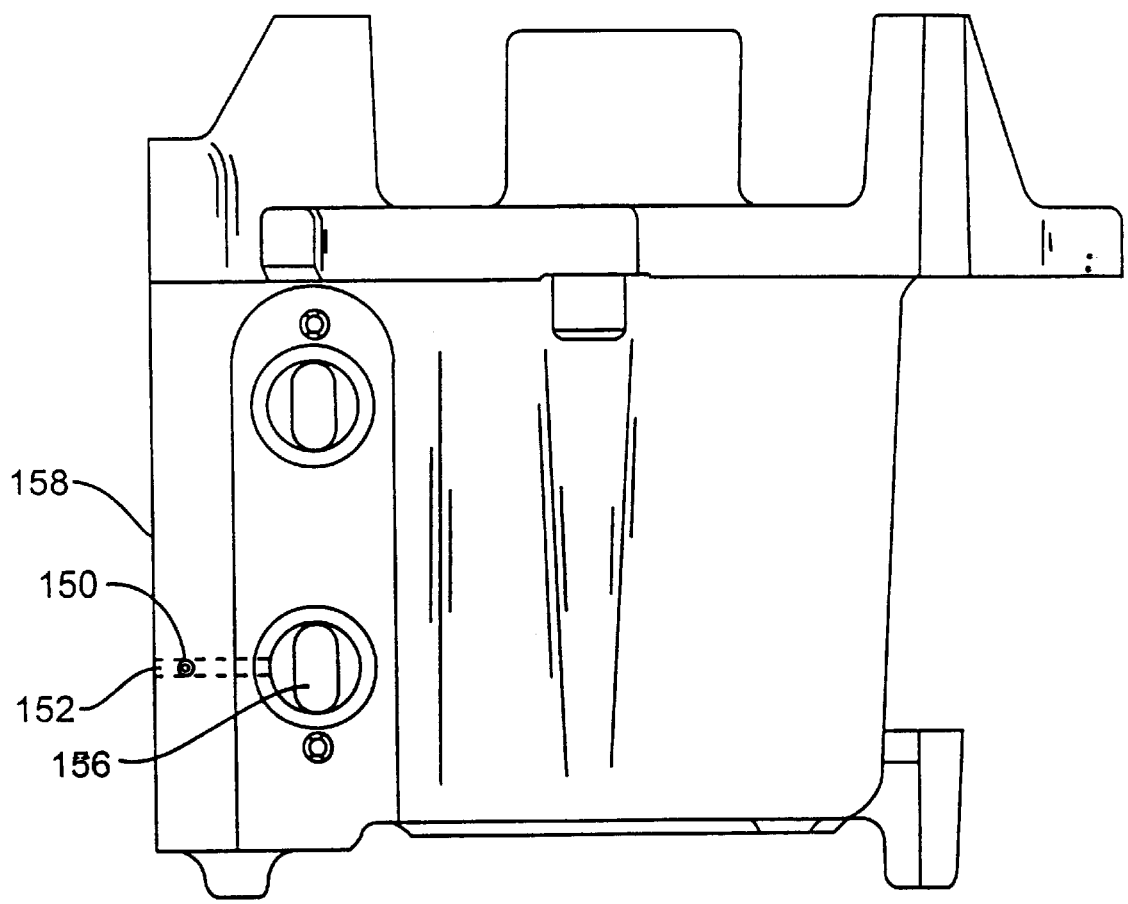
FIG. 40 is a cross-sectional view, with portions broken away for clarity, and taken generally along line 40—40 of FIG. 39 in the direction of the arrows.

FIGS. 39 and 40 illustrate a preferred application of vent holes formed in the block to provide a pressure relief. As shown in FIG. 39, the compressor is a two cylinder compressor having a symmetrical refrigerant suction system. In that embodiment, the compressor is designed so that one piston has a full stroke regardless of the direction of motor rotation, while the second cylinder has a full stroke when motor rotates in the forward direction, and a zero stroke when it rotates in the opposite direction. A vent port 154 is positioned in the wall of the cylinder of the pacified piston, at a point above the pacified position of the cylinder. The vent port is in fluid communication with the suction side of the compressor, so that any pressure differential is relieved. In the preferred embodiment the vent port 154 is in fluid communication with the suction inlet associated with the cylinder of the pacified piston and is positioned slightly above the top surface of the piston, when it is in its pacified position. This is achieved by the incorporation of a bleed channel in the block of the compressor.

FIGS. 39–40 illustrate one manner of forming vent ports and associated relief passages in a compressor of the invention. One hole 152 is drilled in the block from the deck 158 of the crankcase into the suction inlet port 156. The deck end of that hole is later covered and blocked by a valve plate when the compressor is assembled, so that the passage formed by the hole only is in fluid communication with the suction inlet.

A vent port from the cylinder to the hole 152 is then formed in the block. This is achieved by drilling a hole 150 with the first hole and the cylinder bore. Preferably, hole 150 is a step drill having a smaller diameter at the entry point of the hole to the cylinder. Hole 150 intersects with hole 152, providing a fluid passage from the cylinder to the suction inlet. The open end of the hole 150 spaced from the cylinder is plugged off by, for example, a small copper plug, upon assembly.

The above vent port and passage provided sufficient fluid passage to permit any pressure buildup in the cylinder to be relieved, when the piston is in the pacified mode. The hole is sized and positioned, however, such that when the piston is in the operating mode, the piston's movement periodically closes off the vent port and little if any leakage occurs.

It has been found that for a multiple cylinder compressor, the combination of proper counterweight positioned on the cam and the vent port 154 will give marked stability to the cam and greatly diminish if not eliminate junction noise in both the full and reduced capacity operation.

The size and shape of the vent hole diameters are determined based on a specified compressor construction and operating characteristics. The vent port in particular should be sized to provide sufficient pressure relief, while not significantly effecting the efficiency of the compressor.

Figure 15:
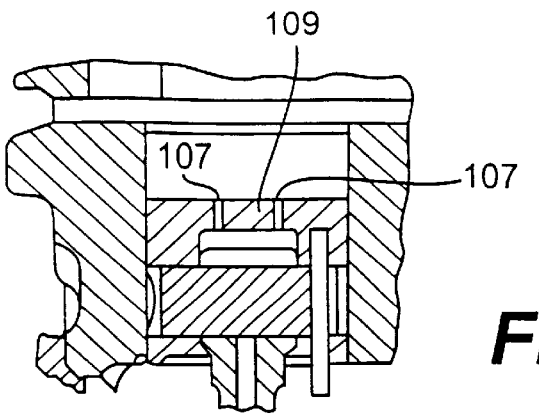
FIG. 15 is a cross-sectional of a switchable piston having one or more small diameter pressure let-down holes thru its top.

In FIG. 15 one or more small bleed apertures 107, like the holes 101 in FIG. 12 are formed thru the top or head 109 of the piston and communicate with the low side.

Figure 16:
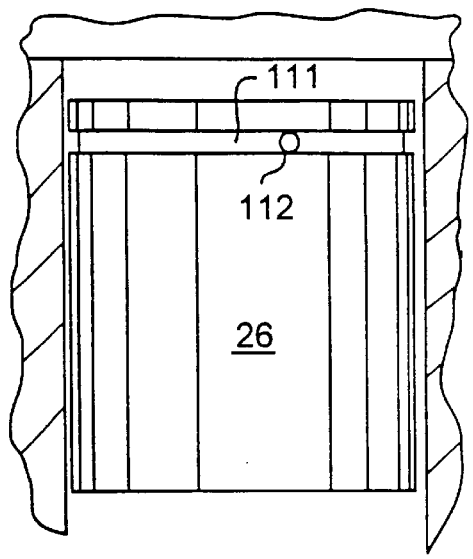
FIG. 16 is a cross-sectional view of a crankcase portion with a modified piston shown in relief.

In FIG. 16, the piston 26 is provided with an annular oil groove 111 which communicates thru an oil feed hole 112 which connects into the oil channels or passages of the crankshaft and connecting rod which feed the bearings and wrist pins thru a conventional pumping action. During active piston operation the pumping action feeds groove 111 under pressure, and the oil forms a seal between the piston and the cylinder wall which substantially prevents the flow of high pressure refrigerant to the low side. When the piston is passive however, the gap 113 between the piston and cylinder wall is not sealed and thus allows any incidental pressure in the compression chamber to let down to the low side.

Figure 17:
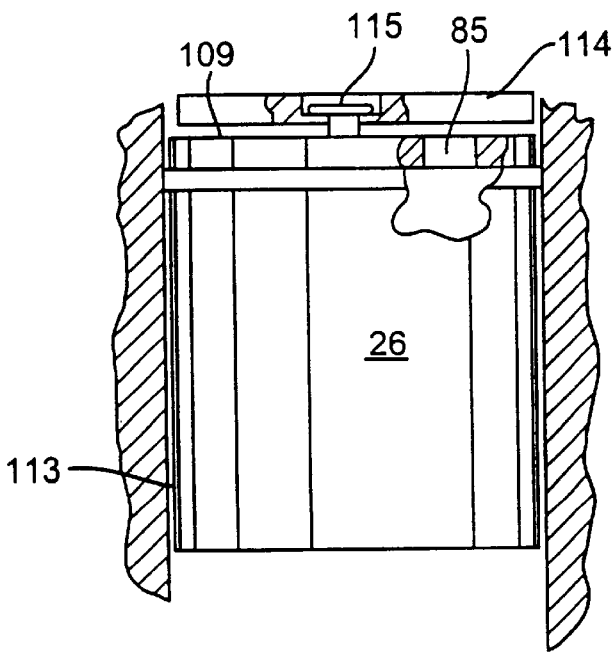
FIG. 17 is a view as in FIG. 6, with portions broken away and showing a piston having a floating suction valve.
Figure 18:
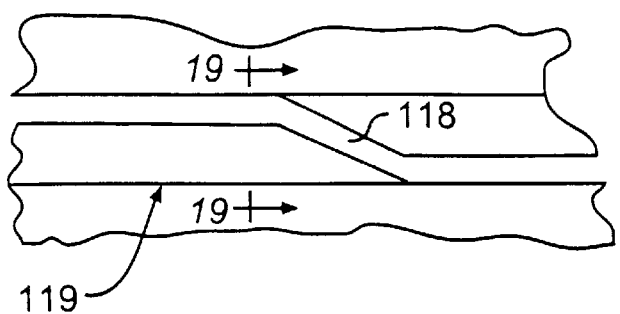
FIG. 18 is a side view of a portion of a piston showing a special sprung compression ring and groove construction in a leaking suction mode.
Figure 19:
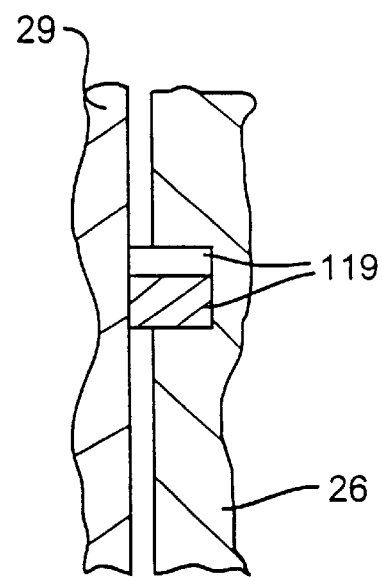
FIG. 19 is a cross-sectional view taken along line 19—19 of FIG. 18.

In FIG. 17, the pressure let down is achieved by employing a suction valve which has an essentially free-floating disc 114 which is loosely held on the piston head by a retainer member such as 115. This disc is shown in its wide open position such as would exist on a normal suction stroke whereby suction port 116 which is in communication with the low side suction gas is wide open. In a passive condition of the cylinder when the suction disc is simply lying on the top 109 of the piston without experiencing any significant sealing gas pressure, the disc and valve port in the piston head do not form a good gas seal, and any incidental pressure forming the compression chamber can readily let down past this disc into the low side. A working example of this embodiment is described more fully below and is shown in FIGS. 32–34.

Figure 20:
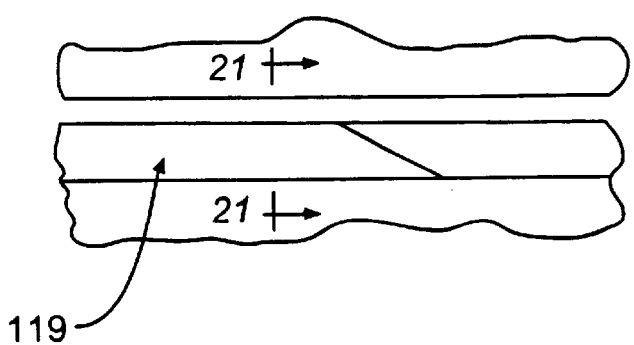
FIG. 20 is a view as in FIG. 18 showing the ring in a sealing compression mode.
Figure 21:
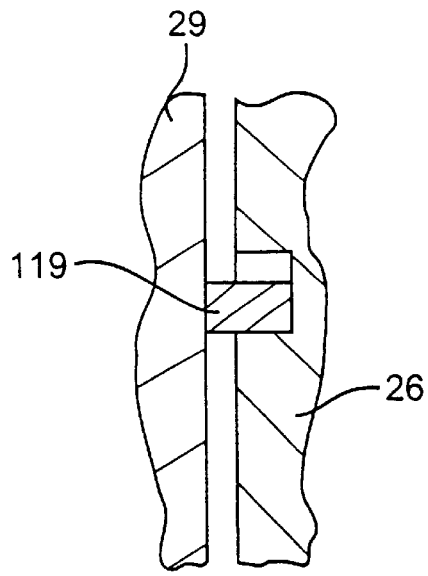
FIG. 21 is a cross-sectional view taken along line 21—21 of FIG. 20.

Referring of FIGS. 18–21, the incidental pressure let down is thru the gap 118 formed between the ends of a twisted or cocked piston ring 119. The ring in its unpressured and leaking condition is an shown in FIGS. 18 and 19, and in its pressured and sealing condition, as on a normal compression stroke, is as shown in FIGS. 20 and 21.

Figure 32:
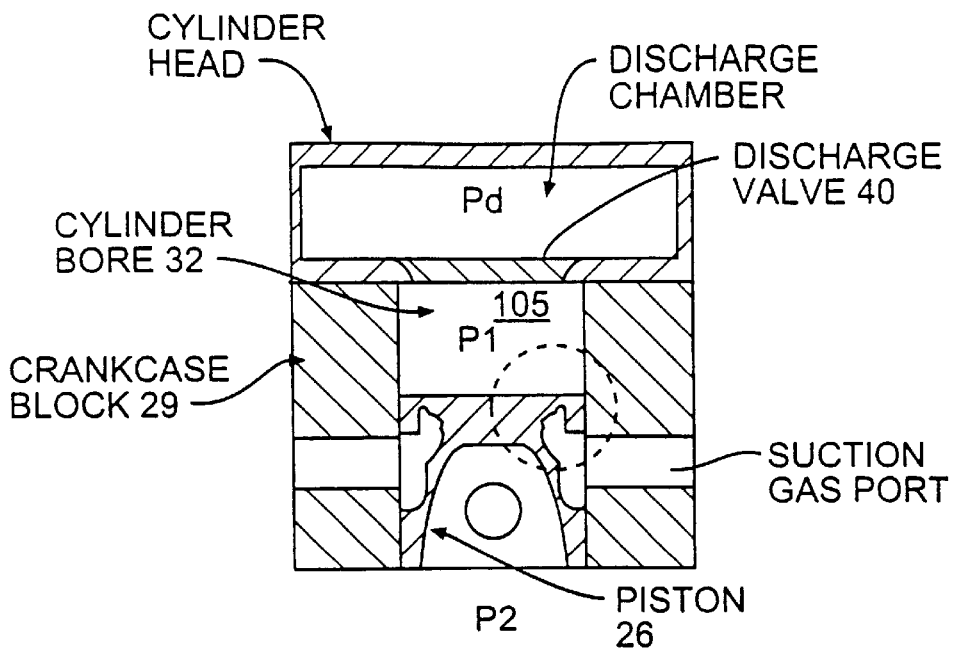
FIG. 32 is a cross-sectional view of a cylinder, piston and bead structure illustrating the configuration of the pressure let down suction valve disc on FIGS. 1 and 2 on the compression stroke.
Figure 33:
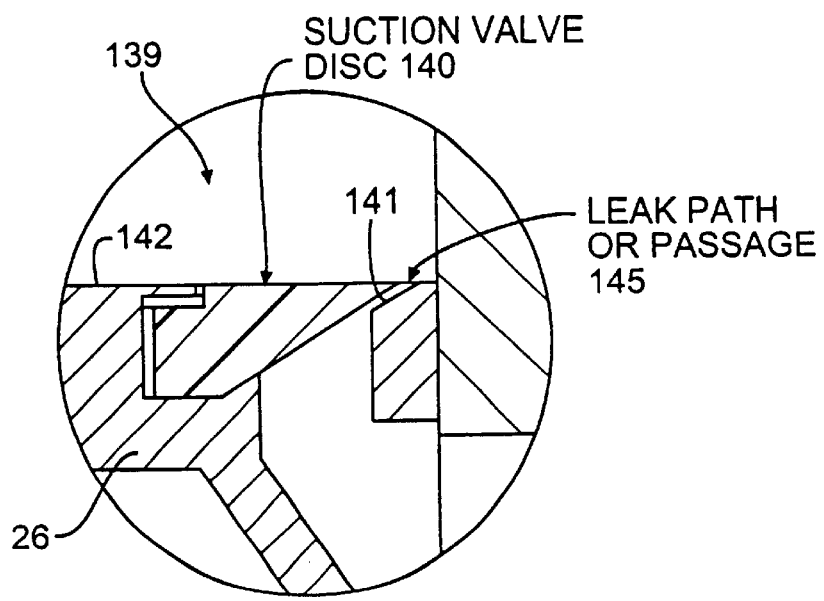
FIG. 33 is an enlarged view of the encircled portion of the suction valve of FIG. 32 illustrating the configuration of said valve disc during pacified cylinder operation.
Figure 34:
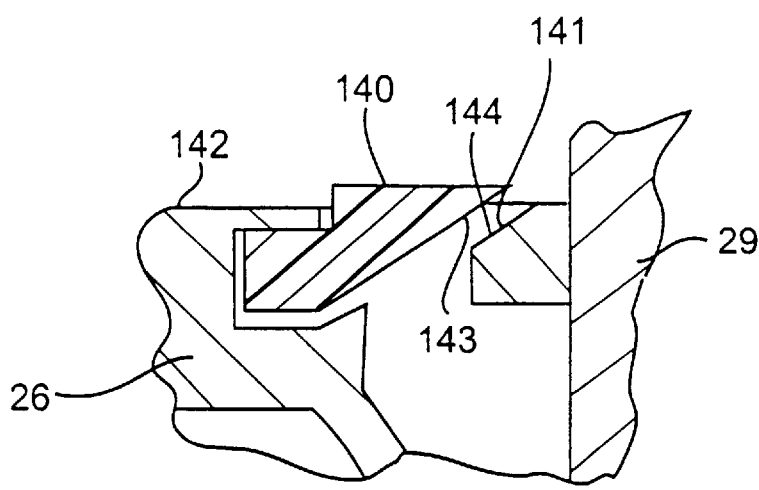
FIG. 34 is a view as in FIG. 33 showing the valve disc position on the suction stroke.
Figure 35:
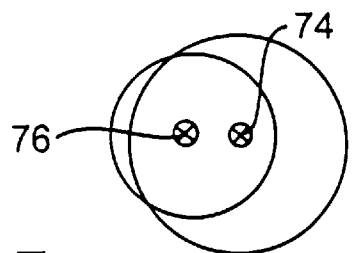
FIG. 35 is a view similar to FIG. 3, but showing throw data for conventional cylinder.
Figure 36:
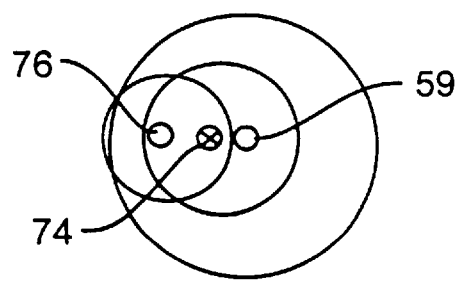
FIG. 36 is a view similar to FIG. 35, but showing throw data for one preferred adjustable throw cylinder in accordance with the present invention.

Referring particularly to FIGS. 32–34 and with reference to claims 19–24, a highly preferred pressure regulating means comprises a suction valve structure generally designated 139 having a free-floating valve disc 140 and a suction port seat 141, wherein said disc is comprised of resilient, pressure deformable material and is mounted in the piston head 142 such that a sealing face 143 of said disc is normally slightly spaced from a cooperating sealing face 144 of said seat to provide a pressure let-down passage 145, said disc being deformable by the pressure in the compression chamber 105 on the compression stroke whereby said faces which are preferably annular contact each other and form a compression seal.

The disc 140 is pressure deformable, semi-rigid, highly resilient and comprised of material selected from one or a blend of polyamide, polyimide, poly (amide-imide), polycarbonate, polystyrene, polytetrafluoroethylene, cellulose ester, polyester, vinyl polymers, polyolefin, or copolymers thereof. The leak path 145 can range in width, i.e., the distance between the two faces 143, 144, from e.g., about 0.001 in. to about 0.02 in. or more, depending on the coefficient of leakage ("COL") desired and the materials of construction of the disc.

Figure 24:
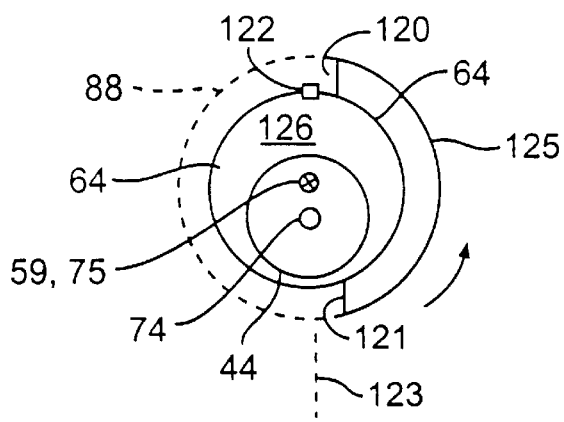
FIG. 24 is a top view of the cam of FIG. 22.

An embodiment of the cam dog and crankshaft stop construction of the present invention are shown in FIGS. 22–27 wherein in FIG. 24 the crankshaft is rotating counterclockwise and the cam is in its pacifying position. In this embodiment, the bushing 88 carries a single stop 119 and the cam 64 carries a pair of dogs 120 and 121, and wherein the dog and stops are positioned such that the apex 122 of the cam will lie substantially in the orbital plane 123 of the crankpin at each dog or end point 120 and 121 of the cam rotation. It is noted that orbital plane 123 is defined by the crankpin shaft center axis 74 and the rotational axis 76 of the crankshaft. This construction provides for selected full or zero piston stroke.

Figure 28:
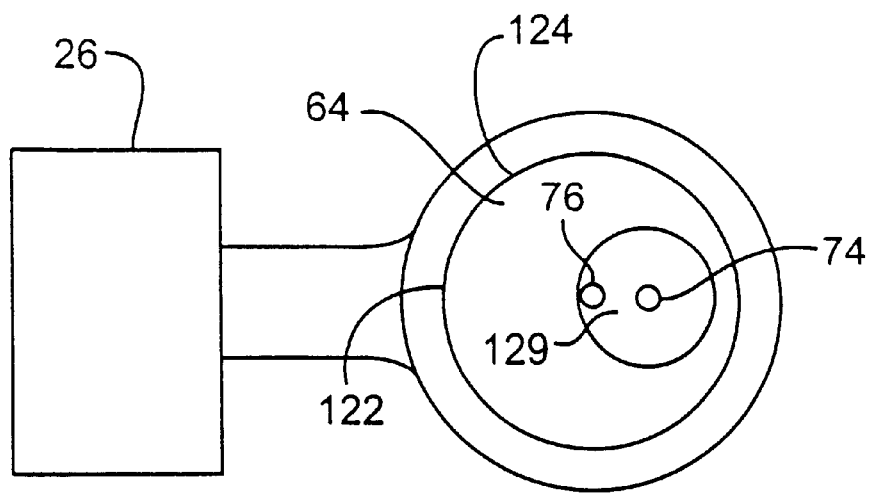
FIG. 28 is a further explanatory view of a pacified piston.
Figure 29:
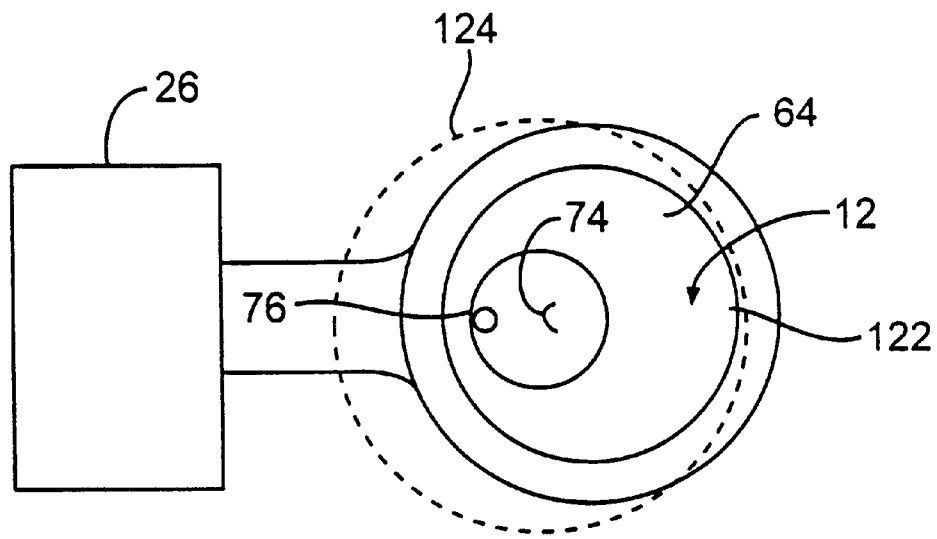
FIG. 29 is a further explanatory view of the piston of FIG. 28 in a fully active, i.e., full stroke mode.

The relative angular orientations of the crankpin, cam and crankshaft at the two end points are given in FIGS. 28 and 29 wherein the cam is dimensioned such that in its proximal or pacifying orientation of FIG. 28 the orbit 124 of the crankpin (i.e., crankpin shaft 129+cam 64) is concentric with the crankshaft axis 76. Conversely, in the fully operational orientation of the cam as in FIG. 29 the orbit 124 of the crankpin is at its maximum radius "r".

In this embodiment the stabilizing structure comprises a counterweight mass 125 added to the cam body 126. In this particular embodiment, the dogs 120 and 121 or end points are provided on the mass. The stop surfaces (dogs) on the cam, however, can be placed on a variety of surfaces or positions of the cam. Similarly, the corresponding surfaces against which the stops of the cam engage can be formed on a variety of surfaces on, or fixed to, the crankshaft.

Figure 22:
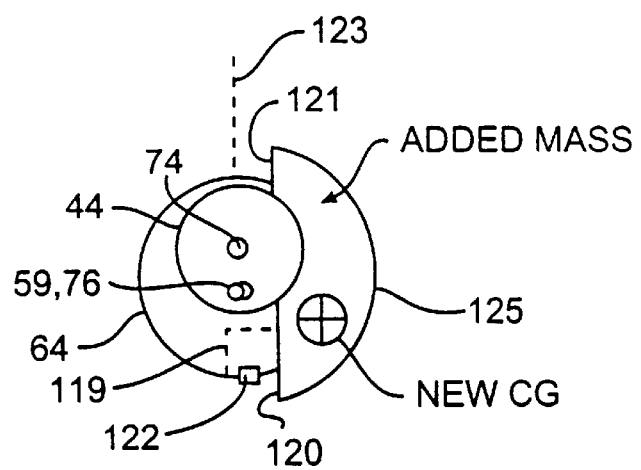
FIG. 22 is a bottom view of a preferred weighted, double stop cam for developing CFT for stabilizing the junction(s)
Figure 23:
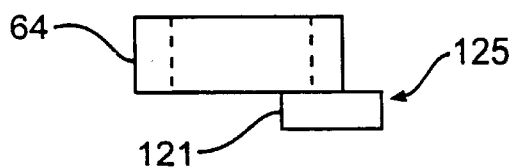
FIG. 23 is a side view of the cam of FIG. 22 rotated 90° thru the plane of the drawing paper.

Added mass 125 shifts the center of gravity (CG) of the cam as shown, e.g., in FIG. 3 from its approximate position as shown therein to the approximate new position shown in FIG. 22. This new CG position which is offset, i.e., in advance of, the aforesaid orbital plane 123 which passes thru the crankshaft axis and the crankpin axis will generate a CFT tending to maintain the junction(s) against the aforementioned destabilizing forces. This modified cam structure, thru proper design of its configuration and weight distribution, can be tuned to produce a variety of desired CFT, e.g., from about 10 to about 50 in lbs at a conventional crankshaft rotational speed of 3600 rpm. Such a CFT will substantially, if not totally, offset the destabilizing forces generated during active piston reciprocation.

In each embodiment of the two-stage compressor of the present invention, a means must be provided for assembling the eccentric cam onto the crankshaft and holding the cam in position. In certain instances, the means includes a cap 117 which is placed over the end of the crankshaft and holds the eccentric cam in position. In other embodiments, the means includes a hole and pin arrangement, as described more fully below.

As shown in FIGS. 22–27 and previously described, in one embodiment the cam dog and crankshaft stop construction a bushing 88 ultimately is fixed to the crankshaft and provides a single stop 119 which contacts a pair of stops 120 and 121 formed on the cam. In this and other embodiments, one or more stops are formed on or adjacent the crankpin at angularly separate points and the eccentric cam includes a pair of dogs for selective engagement with the stops. The system further includes a mechanical system for holding the cam in its axial position on the crankpin, when the eccentric cam and crankshaft are fully assembled.

In an embodiment in which a bushing with a stop is attached to the crankshaft, the mechanical system includes an end cap heat shrunk onto the shaft. As an alternative, the end cap can be screwed onto the shaft. Other known mechanical means of affixing the bushing or end cap to the shaft are within the principles of the invention, and the end cap can either include or not include stops for interacting with the cam. To the extent that the end cap does not include such stops, the stops would be formed on the crankshaft itself, and the end cap would merely hold the cam in the axial position on the crankshaft, once the crankshaft, cam, and end cap components were fully assembled.

Figure 41:
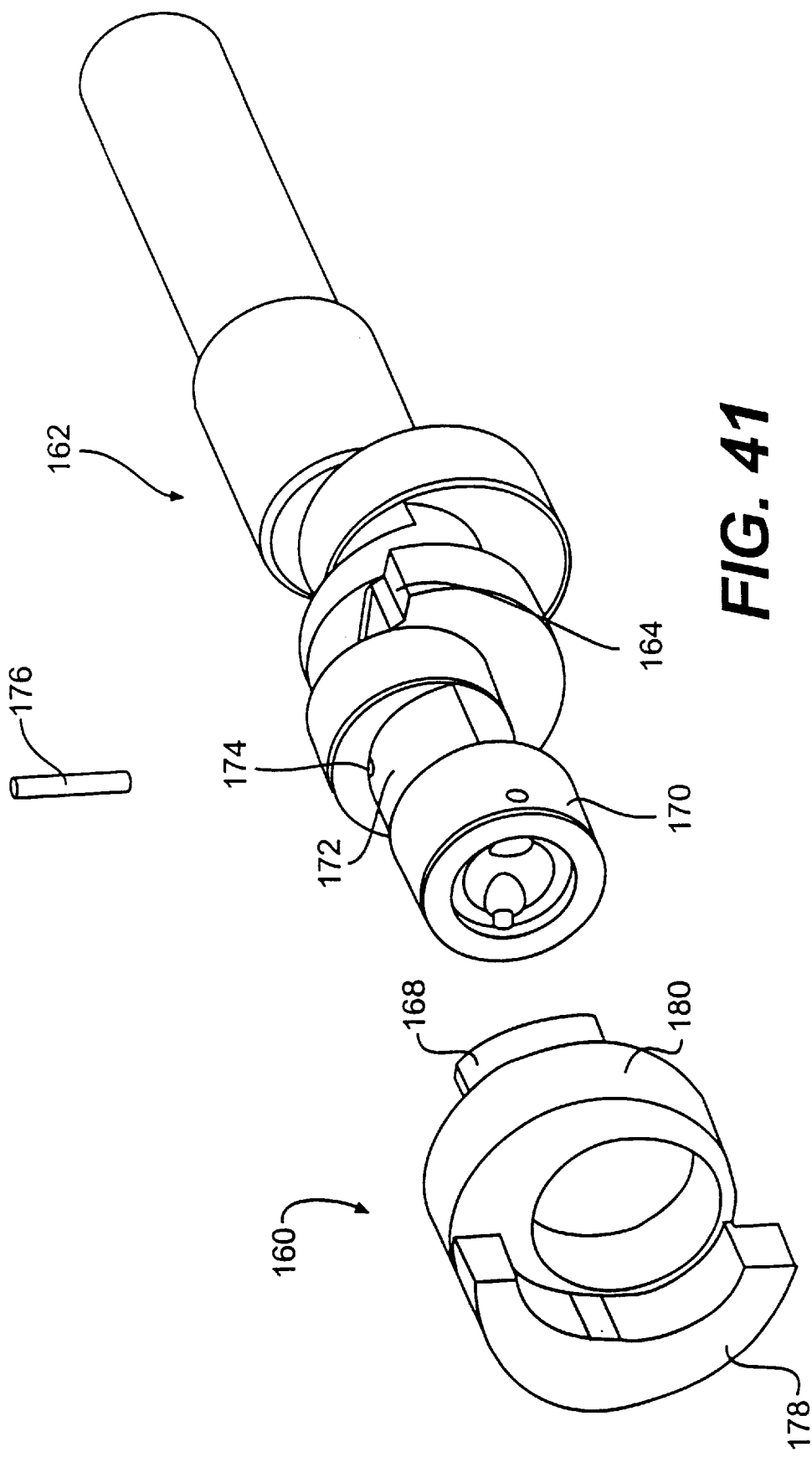
FIG. 41 is an exploded view of a crankshaft and cam assembly, illustrating an eccentric cam and a crankpin.
Figure 42:
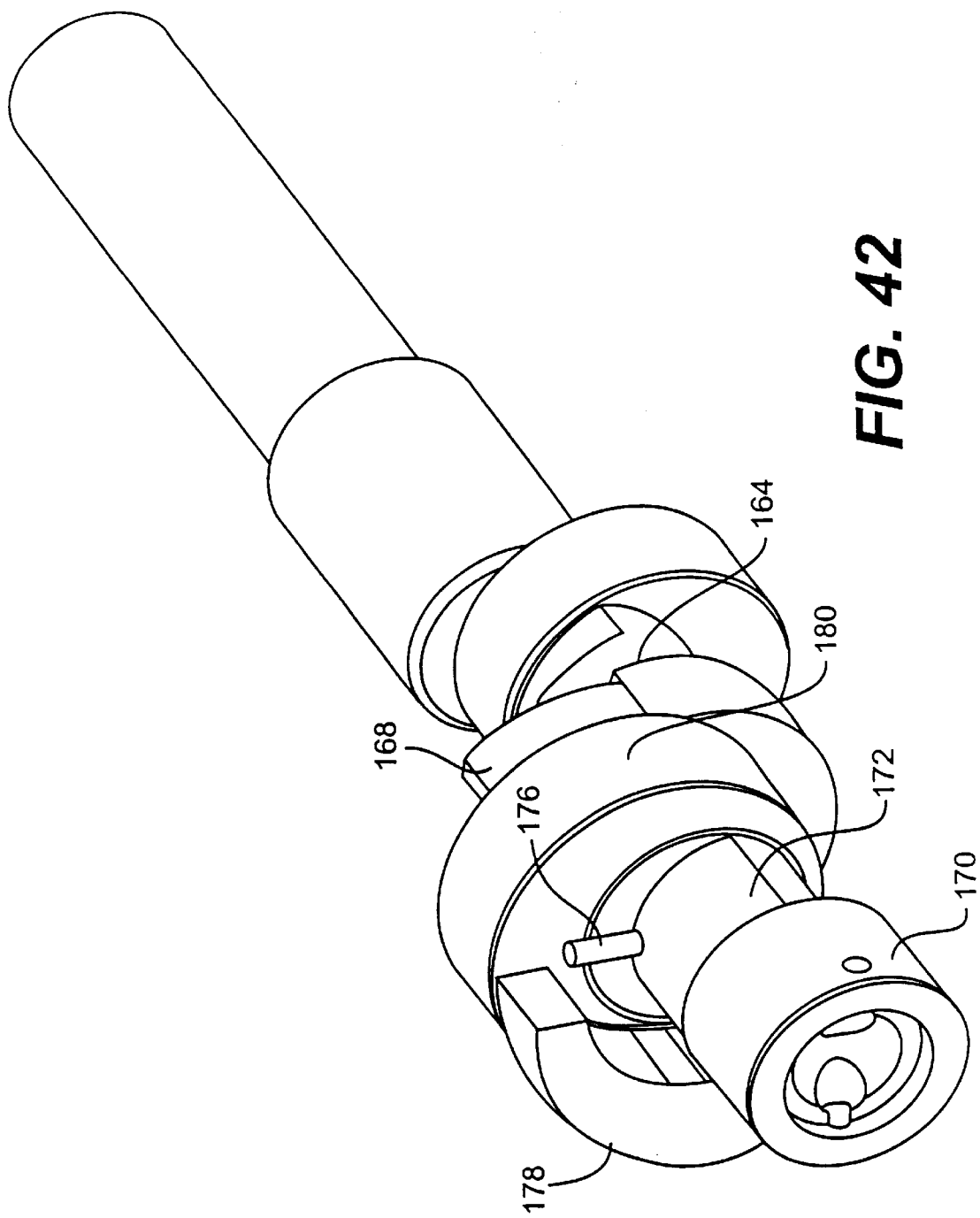
FIG. 42 is a perspective view of the crankshaft and cam assembly of FIG. 41.
Figure 43:
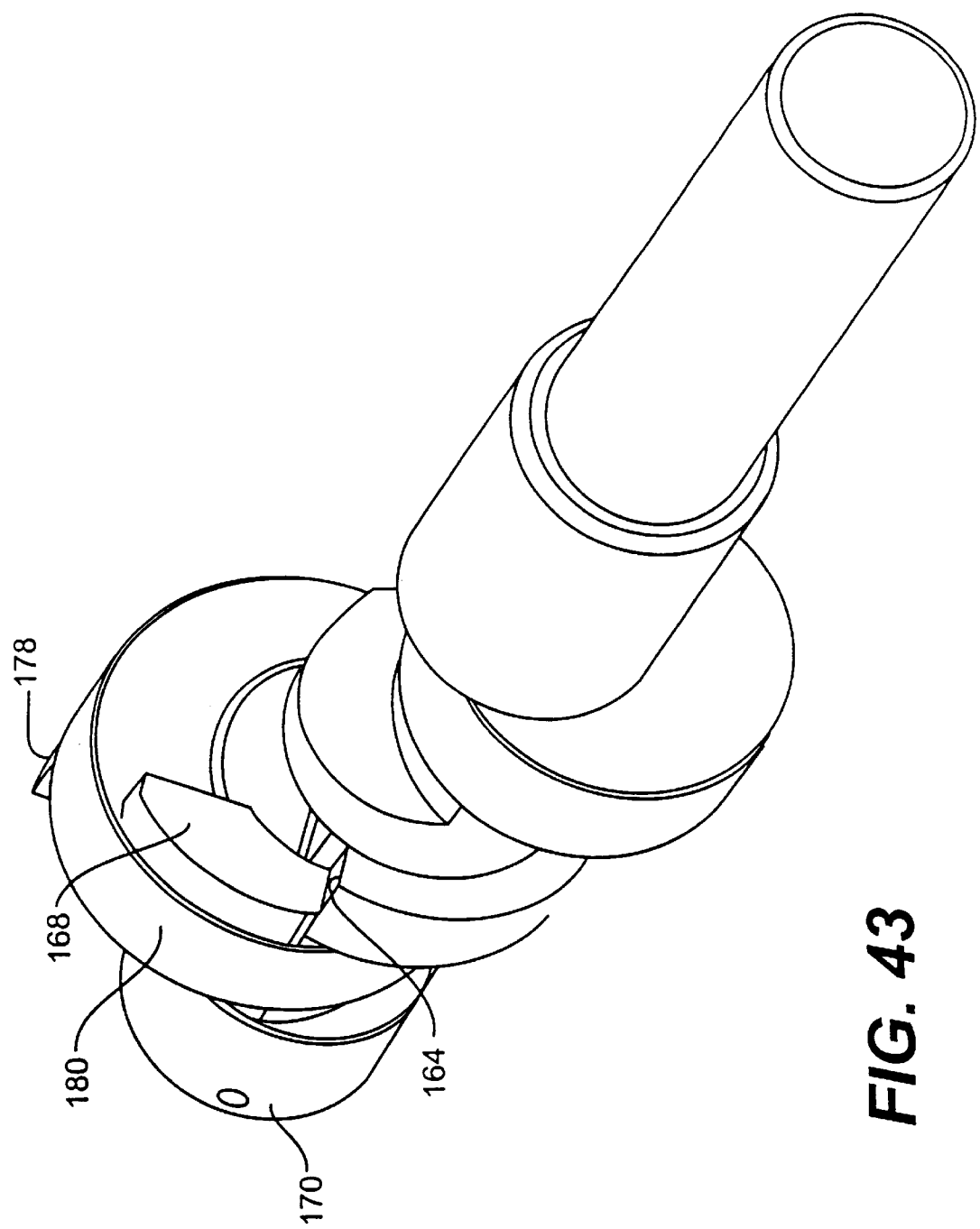
FIG. 43 is a perspective view of the crankshaft and cam assembly of FIG. 41 illustrating the two cylinder mode of operation.
Figure 44:
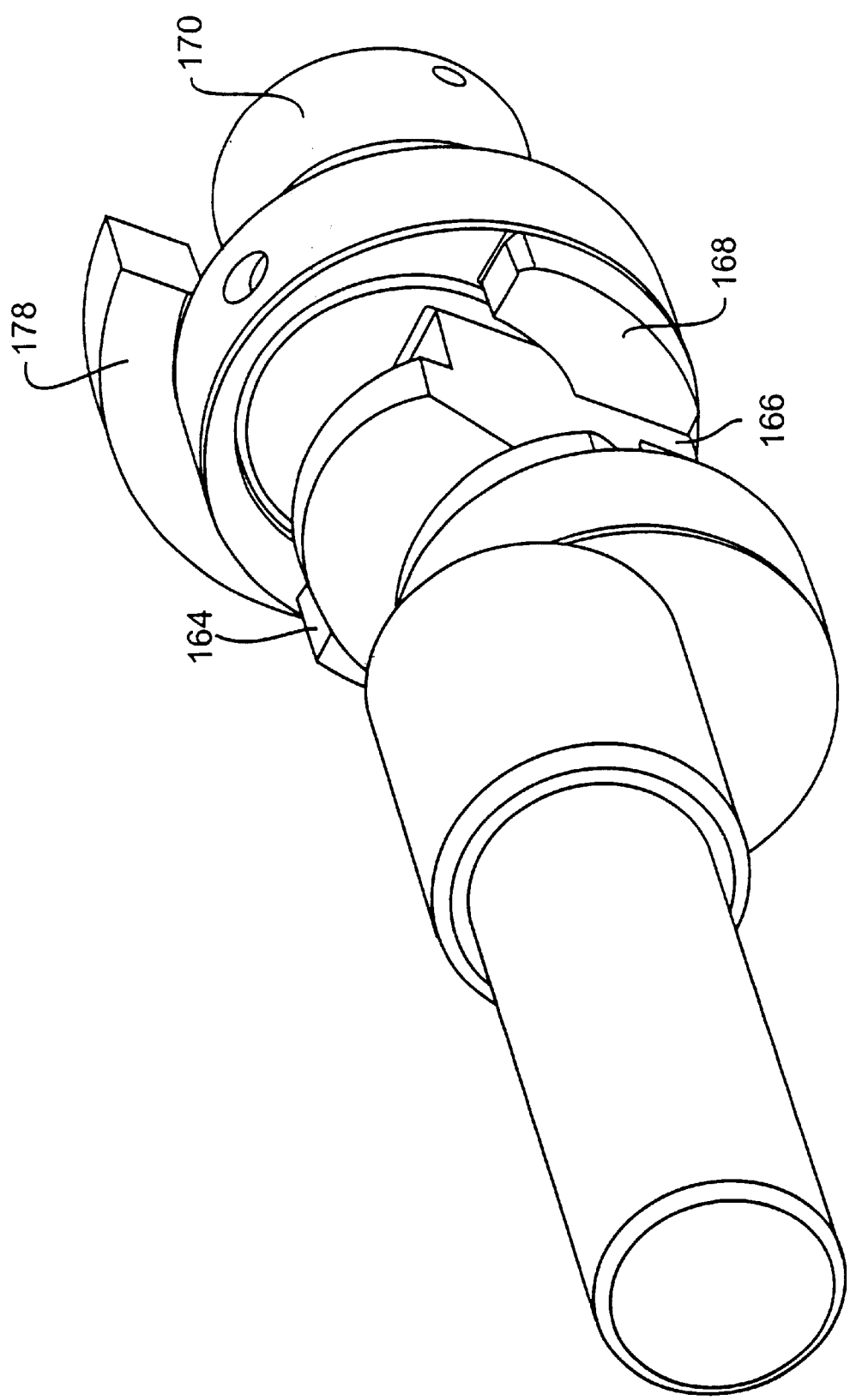
FIG. 44 is a perspective view of the crankshaft and cam assembly of FIG. 41, illustrating the single cylinder mode of operation.

A presently preferred embodiment of the crankshaft and cam assembly are illustrated in FIGS. 41 through 44. FIG. 41 shows an exploded view of the eccentric cam 160 and crankpin 162 while FIGS. 42–44 shows assembled views. In FIG. 43 the cam is rotated to the two cylinder mode of operation, while in FIG. 44 the cam is rotated to a single cylinder mode of operation, in that the cam and crankshaft are designed to reduce the stroke of the associated piston to zero. In this embodiment the crankpin includes two lands 164, 166 formed on the crankpin, and the cam includes an extension 168 having two opposite sides that serve as dogs or stop surfaces to engage one of the lands, as the compressor reverses direction. As shown, the eccentric cam 160 fits over the crankshaft such that the lands and stops are aligned and engage one another, during the operation of the compressor. In assembly, the eccentric cam 160, is slid over the end or sump journal 170 of the crankshaft and also over an idler segment 172 between the sump journal and the portion of the crankshaft on which the eccentric ultimately rides.

As shown, a radial hole 174 is formed in the crankpin. As shown, the cam has a diameter equal to or larger than the diameter of the sump journal and the idler segment and has an axial length that is short than the axial length of the segment. Once the cam is slid over the sump journal and idler segment of the crankshaft, the pin is extended into the radial hole of the crankpin and rides against a side surface of the cam holding it against axial movement.

In the preferred embodiment the cam includes an eccentric counter weight 178 on one side of the cam. Most preferably this eccentric counter weight is generally formed in the shape of a "C." The exterior 180 of the cam is on the opposite side of the eccentric counter weight. The eccentric counter weight 178 and the cam in its entirety is designed that the cam develops a centrifugal force that tends to keep the lands and stops in engagement during the forward and reverse rotation of the crankshaft.

The method of assembling the crankshaft with an eccentric cam thus includes the steps of providing a crankshaft with a proximal and distal ends, a sump journal on the distal end of the crankshaft and axially aligned with the crankshaft, an idler segment adjacent to sump journal and out of alignment with the axis of the crankshaft, and a crankpin between the idler segment and the proximal end of the crankshaft. The crankpin includes a radial hole formed in and extending to its outer surface. The method further includes the step of providing an eccentric cam having an internal bore equal to or larger than the diameter of the sump journal and the idle segment and an axial length less than the axial length of the idler segment. The cam is slid over the sump journal and idler segment onto the crankpin. It is then connected by inserting a pin through the radial hole of the crankpin until the pin is fixed to the crankpin and rides against a side surface.

The above desired weighted cams can effectively diminish a substantial portion of the destabilizing forces for many compressor constructions and operating parameters. However, it has been found that at least in situations where a zero piston stroke mode is attempted, some additional stabilizing means is necessary, particularly in view of the space limitations imposed upon the structure and the allowable dimensions of the crankpin and connecting rod bearing, and upon the allowable dimensions of the connecting rod oscillations, by the structural confines of the compressor crankcase.

Thus, one or a combination of the stabilizing structures of the present invention as defined above and further below can be used very effectively, particularly in combination with the above described weighted cam to provide a substantially comprehensive stabilizing structure.

The present invention thus includes the method of stabilizing a compressor throw adjusting cam of a compressor having a complex crankpin journal, against destabilizing forces, wherein said cam forms part of said journal and is angularly adjustable about the shaft of said crankpin between angularly spaced end points which are delineated and established as junction(s) by structural stop and dogs means on the crankshaft and cam respectively and wherein said destabilizing forces comprise refrigerant pressure differentials and mechanical inertial forces acting on the piston associated with said crankpin throw. A preferred method comprises counteracting said destabilizing forces by a combination of centrifugal torque forces generated by a cam with an integral counterweight that tends to maintain at least one of said junction(s), and by pressure let down means tending to reduce any pressure differentials between the cylinder of the pacified piston and the low side of the compressor. A preferred combination is the cam illustrated FIGS. 41–44 and the pressure letdown provided by either the vent port systems of FIGS. 39–40 or the suction valve of FIGS. 32–34.

An example of a compressor according to the principles of the invention will further illustrate preferred embodiments of the present invention.

EXAMPLE I

A preferred embodiment of the stabilizing means or structure of the present invention, but by no means limiting, structural, dimensional, and operating parameters therefor, is given below as an example in the context of a dual piston refrigeration compressor of about 40,000 Btu/hr capacity. The compressor has volumetric capacity cylinder #2, wherein the crankpin throw of cylinder #1 is shiftable from a zero piston stroke position to a full piston stroke position, and vice-versa. In this example, the stabilizing structure comprises a free-floating suction valve disc of the general types shown, e.g., in FIGS. 17 and 32–34, and in the aforementioned U.S. Pat. Nos. 5,080,130; 5,106,278; and 5,203,857, in combination with a CFT generated by the weighted cam as show in FIG. 22 and FIGS. 41–44. The weight of the valve disc in this example is negligible and does not factor into the calculation of the Coefficient-Of-Leakage (COL). Also, this COL is independent of the areas and configurations of the actual contact or sealing surfaces between the disc and suction port, as well as the materials of construction of said surfaces and represents an extremely coherent design tool.

| | |
|---|---|
| (1) maximum volumetric capacity of shiftable cylinder #1 | (3.5 in$^3$); |
| (2) non-variable volumetric capacity of cylinder #2 | (3.5 in$^3$); |
| (3) normal operating pressure range in shiftable cylinder #1 in its fully active mode | (77 to +297 Psig); |
| (4) normal operating pressure range in cylinder #2 in its fully active mode | (77 to 297 Psig); |
| (5) experienced pressure range in shiftable cylinder #1 during normal compressor operation of piston #2 and with piston #1 in its substantially fully passive mode, i.e., wherein the #1 piston moves less than about 10% in either direction beyond the mid-point of its fully active stroke | (0 to 40 Psig); |
| (6) COL* (0.2, preferably ranging from about 0.03 to about 0.5 and most preferably from about 0.5 to about 0.35); | |
| (7) CFT generated by cam at crankshaft speed of 3600 rpm | (10.0 in lb to about 20.0 in lb); |
| (8) maximum crankpin throw radius for piston #1 | 0.550 in; |
| (9) maximum crankpin throw radius for piston #2 | 0.550 in; |
| (10) top surface of suction valve disc | about 2.0 to 2.5 in$^2$; |

-continued

*This coefficient is the ratid of the sealing pressure of the suction valve disc structure to the refrigerant leakage flow rate thru the suction valve, wherein said sealing pressure is equal to the total pressure on the compression side, i.e., the entire top surface of the valve disc, in lb, and wherein the leakage flow rate is in in³ per minute of refrigerant leaking past the substantially closed or semi-closed suction valve at a constant pressure differential across the suction valve, i.e., between the idle compression chamber and the low side, of 20 Psig at a temperature of 20° C.

This coefficient, in terms of its units would be, $$COL = \frac{lb \cdot min}{in^3}.$$

Figure 37:
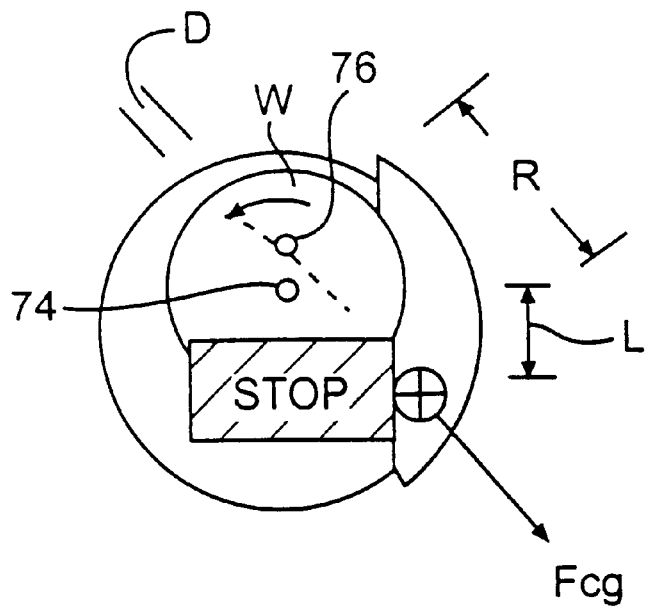
FIG. 37 is a view similar to FIG. 22 and showing how the desired CFT is calculated for a fully active piston.
Figure 38:
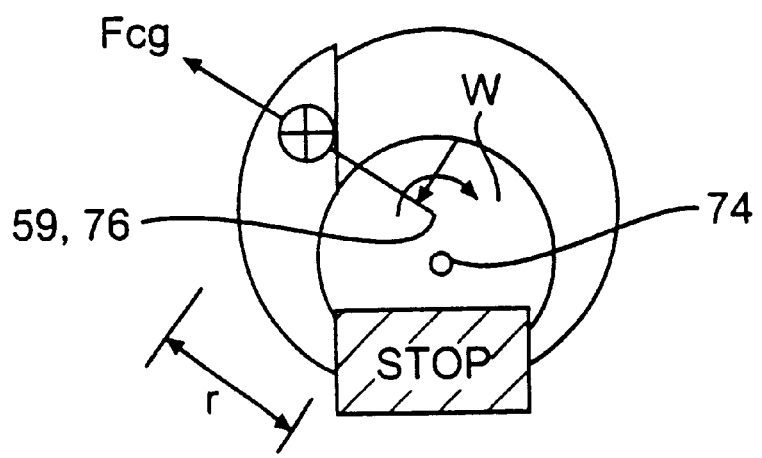
FIG. 38 is a view similar to FIG. 37 but showing the cam in its pacifying orientation, and the calculation for the desired CFT.

- Centrifugal Force Torque (CFT) Calculation - See FIGS. 37 & 38
  m = mass of cam = 0.3 lb · in.
  W = rotational velocity of crankshaft.
    = 3600 rpm = 377 radians/second (there are 2 pi radians per revolution of the crankshaft).
  R = distance between the rotational axis of the crankshaft and the cam center of gravity = 0.500 in.
  gc = gravity constant = 386.4 $\frac{lbm \cdot in}{lbf \cdot sec^2}$, wherein
lbm = pound mass and lbf = pound force.
Force (Fcg) acting on cg (center of gravity) of cam due to $$\text{rotation} = Fcg = \frac{mw^2R}{gc} = \frac{0.3\,(377)^2(0.5)}{386.4} = 55.18\,lbf$$

Fcg · D = Resulting centrifugal force to (CFT) around center torque crankpin shaft.
D = perpendicular distance between the center axis 74 of the crankpin shaft and the Fcg line of action, i.e., the line passing thru the rotational axis of the crankshaft and the cg of the cam.
CFT = 55.18 lbf (0.120 in) = 6.90 in · lbf $$\text{Contact force between stop and dog} = Fs = \frac{CFT}{L}$$

L = distance from center axis 74 of crankpin shaft to center of contact between the dog and stop = 0.500 in
$Fs = \frac{6.90}{0.50} = 13.8\,lbf$ Lubrication Mechanism and System The present cam and crankshaft structure can give rise to lubrication problems, particularly of the connecting rod and wrist pin bearings since the cam is interposed between the main oil galleries or passages and the con-rod bearing and wrist pin bearing. These galleries rise substantially vertically, i.e., longitudinally thru the crankshaft normally and branch off to each con-rod bearing and thence thru the con-rod oil passage to the wrist pin bearing.

Three unique lubrication systems for supplying oil to the con-rod bearing are shown in FIGS. 45a and 45b, 46a and 46b, and 47a and 47b. It is noted that these systems have general application to compressors which may employ a throw adjusting cam of any construction mounted between the crankpin shaft and con-rod bearing.

Each of FIGS. 45a through 47b illustrate cross sections of the crankshaft and eccentric cam combination, FIGS. "a" illustrating those elements when in the maximum throw position, and FIGS. "b" illustrating them in the minimum position. In these particular embodiments, the eccentric rotates about the crankshaft approximately 180° from the first to the second position. Other degrees of rotation, however, are well within the scope of the invention. As explained below, each illustrated lubricating system applies oil to-the engaging surfaces of the crankshaft and cam between the cam and the bearing surface of the connecting rod. In each system, at least one elongated axial supply is formed in the crankshaft and provides a lubrication gallery, as known in the art.

Figure 45A:
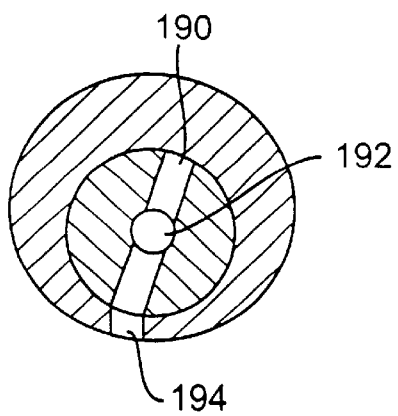
FIGS. 45a and 45b are cross-sections of the crankpin shaft and two angular positions of the cam thereon with one embodiment of a lubrication system according to the present invention.
Figure 45B:
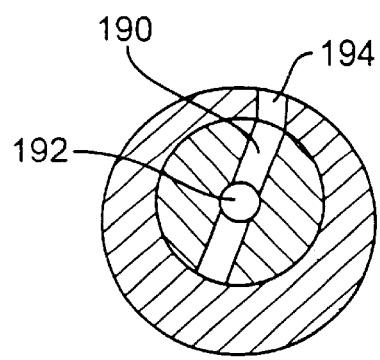

In the embodiments shown in FIGS. 45a and 45b, an elongated axial supply 190 is formed in the crankshaft for providing lubricant upwardly from the bottom of the compressor. A cross drill 192 is formed in the crankshaft and is in fluid communication with the axial supply and an outer surface of the crankpin, as shown. An oil communication hole 194 is then formed in the cam and is positioned so that it is aligned with the radial cross drill in the crankshaft, when the cam is in both the first and second positions, as shown. This oil communication hole 194 formed in the cam is also in fluid communication with the bearing surface (not shown) of the connecting rod. As a result, during the operation of the compressor, oil is pumped upwardly through the elongated axial supply 190 and a portion of that oil flows through the cross drill 192 to the interface of the cam and crankshaft and through the oil communication hole 194 to the bearing surface of the connecting rod.

Figure 46A:
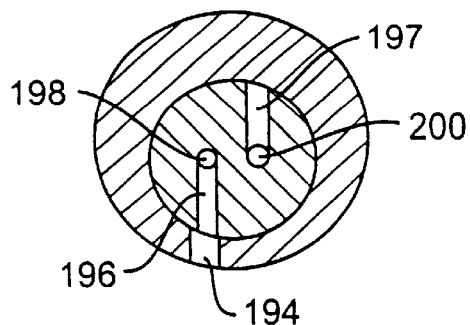
FIGS. 46a and 46b show another embodiment of a lubrication system.
Figure 46B:
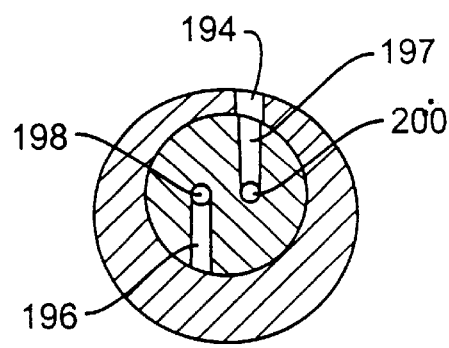

The embodiment shown in FIGS. 46a through 46b includes a pair of elongated axial supplies 196, 197 formed in the crankshaft. A pair of cross drills 198, 200 are then formed in the crankshaft, one in fluid communication with each of the pair of axial supplies and outer surface of the crankpin. An oil communication hole 194 is formed in the cam and is aligned with one of the cross drills when the cam is in the first position and with the other of the cross drills when the cam in the second position. This oil communication hole is in fluid communication with the bearing surface (not shown) of the connecting rod. When the compressor is operated, oil flows upwardly through the oil galleys and then outward through the cross drills to the interface of the connecting rods and eccentrics. In either the first or second position of the cam, the oil communication hole is aligned with one of the cross drills and therefore provides lubricant to the bearing surface of the connecting rod.

Figure 47A:
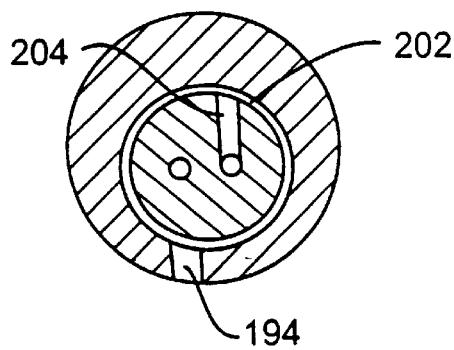
FIGS. 47a and 47b show another embodiment of a lubrication system.
Figure 47B:
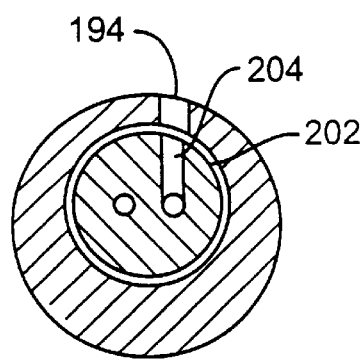

In the embodiment illustrated in FIGS. 47a and 47b, one or more elongated axial supplies are formed in the crankshaft. A circumferential oil groove 202 is formed between the opposing surfaces of the crankshaft and cam, and a cross drill 204 is formed in the crankshaft and placed in fluid communication with the axial supply and the oil groove. This embodiment further includes an oil communication hole 194 formed in the cam and in fluid communication with the oil groove 202 and with the bearing surface (not shown) of the connecting rod. During operation of the compressor, oil again flows upwardly through the elongated axial supply, outwardly through the cross drill to the circumferential groove, and then outwardly through the oil communication hole to the bearing surfaces.

Other embodiments of the lubrication systems that apply the principles of the invention will be readily apparent to persons of ordinary skill in the art, in view of the above teachings and disclosures.

Motor Control

A unique electrical control circuit has been developed for controlling the reversible motor of the present invention. The motor control circuit may also be employed in other motor applications requiring two stage operation. An example of such a circuit is shown schematically in FIGS. 30 and 31.

Figure 30:
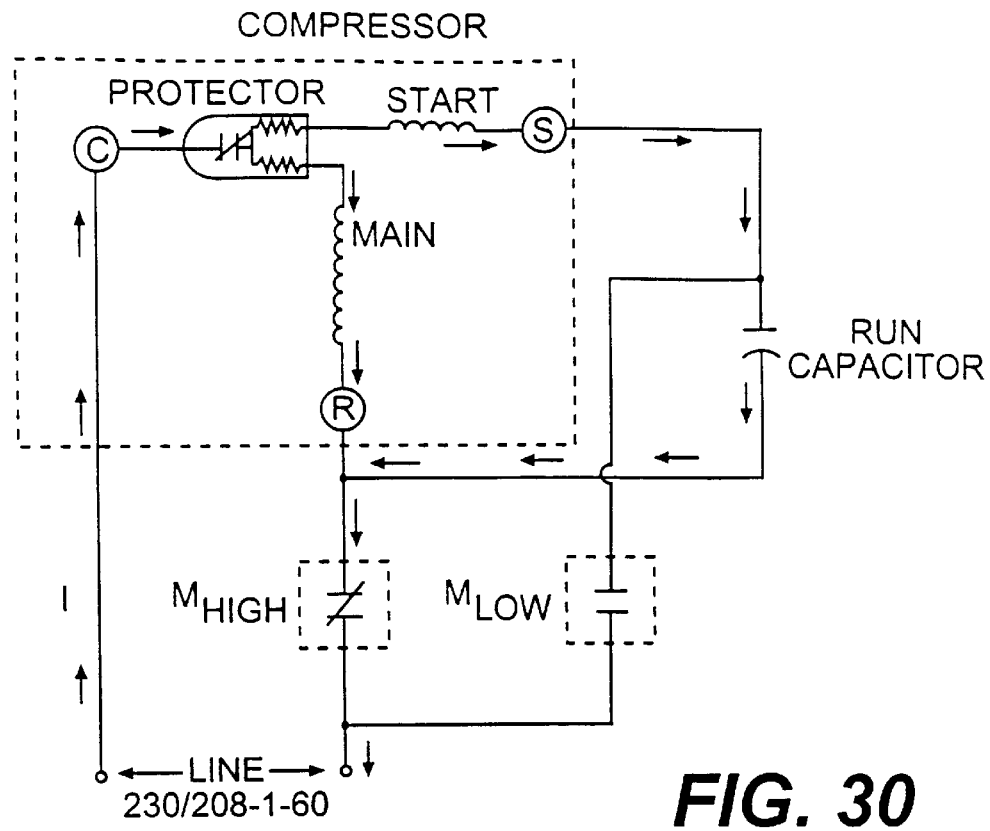
FIG. 30 is an electrical schematic of a preferred motor circuit for two piston full operations.
Figure 31:
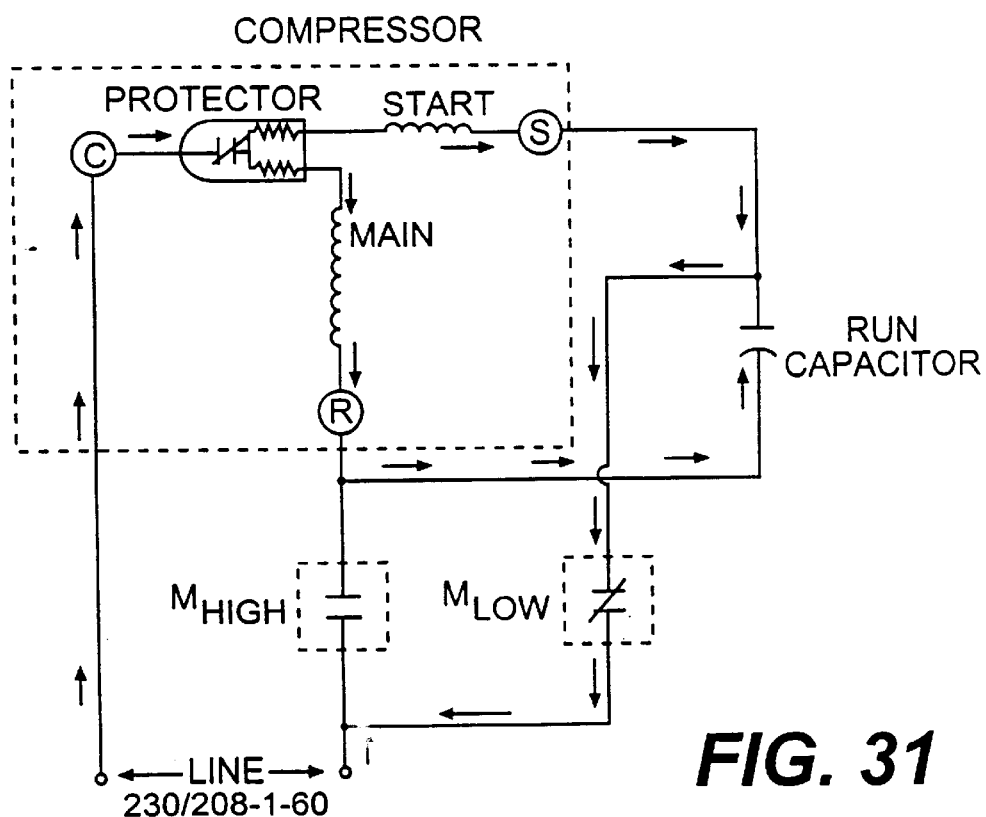
FIG. 31 is an electrical schematic of the circuit of FIG. 30 for one piston full operation.

The Control Schematic of FIGS. 30 and 31 generally illustrate a motor control system that utilizes industry conventional PSC (permanent, split capacitor) wiring schematics that operate a motor using a predetermined power supply. Under the control, the motor is operated on the run windings when it is rotated in one direction and is operated on the start windings when it is rotated in the opposite direction. The windings are chosen such that the motor operates at a first load associated with the maximum load of the compressor when operated in the forward direction and at a second reduced load, again matched to the reduced load of the compressor, when reversed.

Line I runs through the common terminal (C) which leads into a motor protection, which will be disclosed in more detailed below. After leaving the motor protection, the current flow will split, going through both the start (S) and main, i.e., run (R) windings when the M (motor) High contractor or switch closed. At this stage, the motor will be using the run winding as the main winding and places the run capacitor in series with the start winding, obtaining standard motor rotation with two pistons fully active. The contacts in the preferred embodiment are single pole switches, which are inexpensive and readily available.

When the motor is to run the compressor in reverse, contact or switch M low is energized and contact M high is opened. The motor will then be using the start winding as the main and placing the run capacitor in series with the original main winding. Run capacitor placement in this mode facilitates both motor and mechanical rotation changes and simultaneously reduces motor strength to match the resulting reduced or eliminated piston stroke, thus maximizing motor efficiency for the reduced load.

In reversing motor direction, a delay in the relay can be introduced into the system to allow system equalization, or a hard start kit can be used to allow the motor to reverse against load. For example, before the motor is reversed, it can be turned off for approximately a minute or two, before it is reversed.

The windings of the motor are preferably designed to meet the power and speed requirements of the application of the motor, to thereby provide the best match of power and efficiency for the compressor (or other device) when operating at full and low load. Preferably a motor for a given compressor is designed to match the full load capacity of the compressor when it is rotated in the forward direction and the partial load capacity when run in the opposite direction. Preferably, the motor operates at the same speed in both forward and reverse directions.

The matching of a motor with the requirements of a compressor for a given HVAC system in accordance with the present invention includes ensuring that the motor will perform in the most adverse conditions associated with the system load and the line power available. For example, the motor should match the maximum load requirements of a system when the evaporator operates at 55° F., the condenser operates at 155° F., and the line power reduces from 220V/60 Hz standard to 190V/60 Hz. The motor should be designed so that it does not exceed a temperature of 350° F. and that it will not stall. For second stage operation of a compressor providing a 100%/50% split, by two cylinder and one cylinder operation, respectively, the motor at the lower stage should be designed to match the designed second stage mode, at an evaporation temperature of 55°, a condensing temperature of 130°, and 190V/60 Hz line current.

An example of the present unique circuit for use with the compressor of Example I, employs the following structures and operating parameters Motor (reversible) 3–4 hp, single phase Protector—Protects against overload in both load modes. Senses both T° and current.

Power Supply—Single of any frequency or voltage, e.g., 230V–60 $H_z$ single phase.

Switching Mechanism—two single pole switches controlled by an HVAC control such as a two stage thermostat. The control circuit is responsive to load requirements to place the Run Capacitor in series with either the Start winding or Main winding, depending on the load requirements.

Motor Protection

Figure 48:
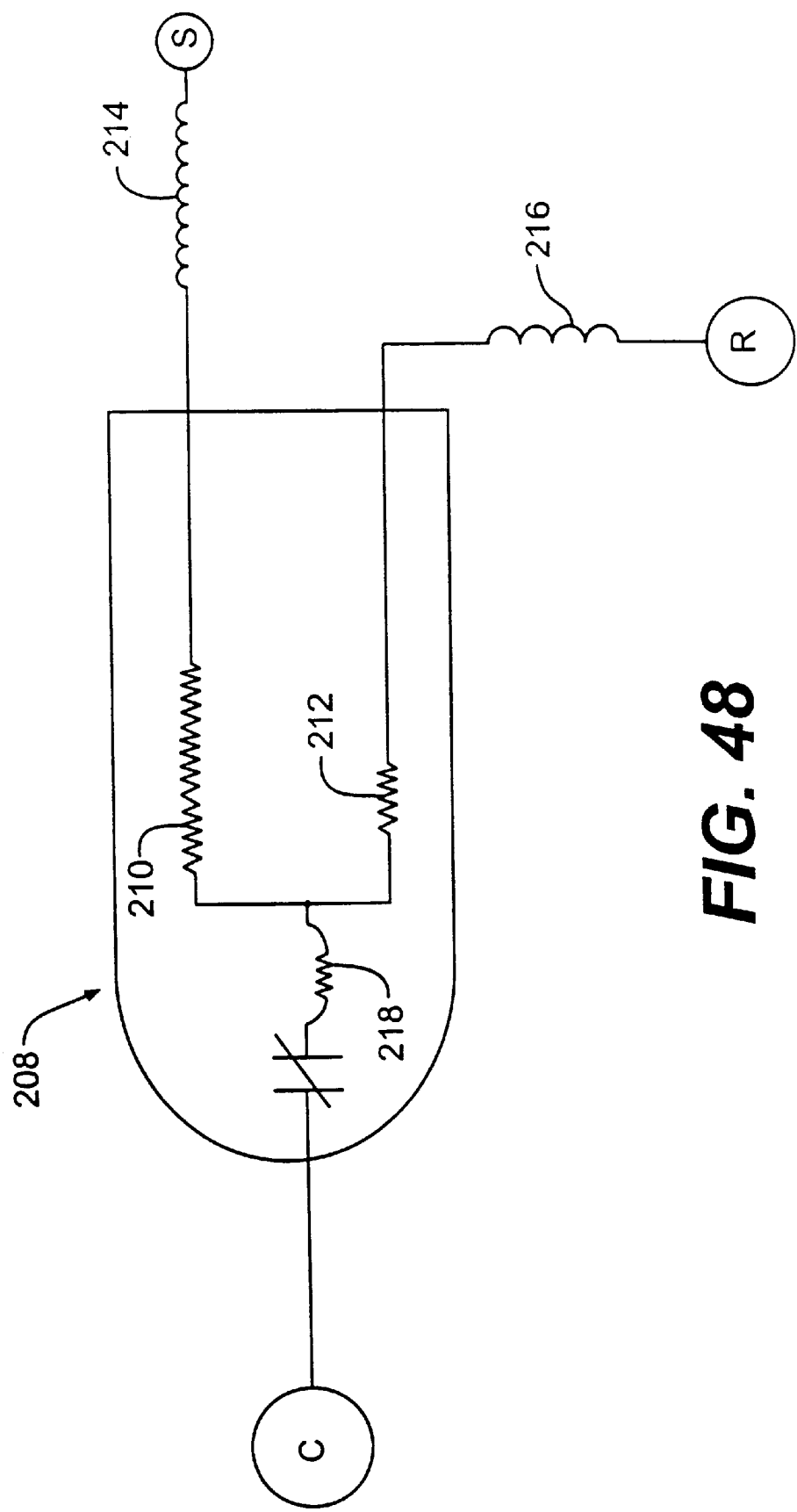
FIG. 48 is a schematic view of a three terminal motor protection according to the present invention.
Figure 49:
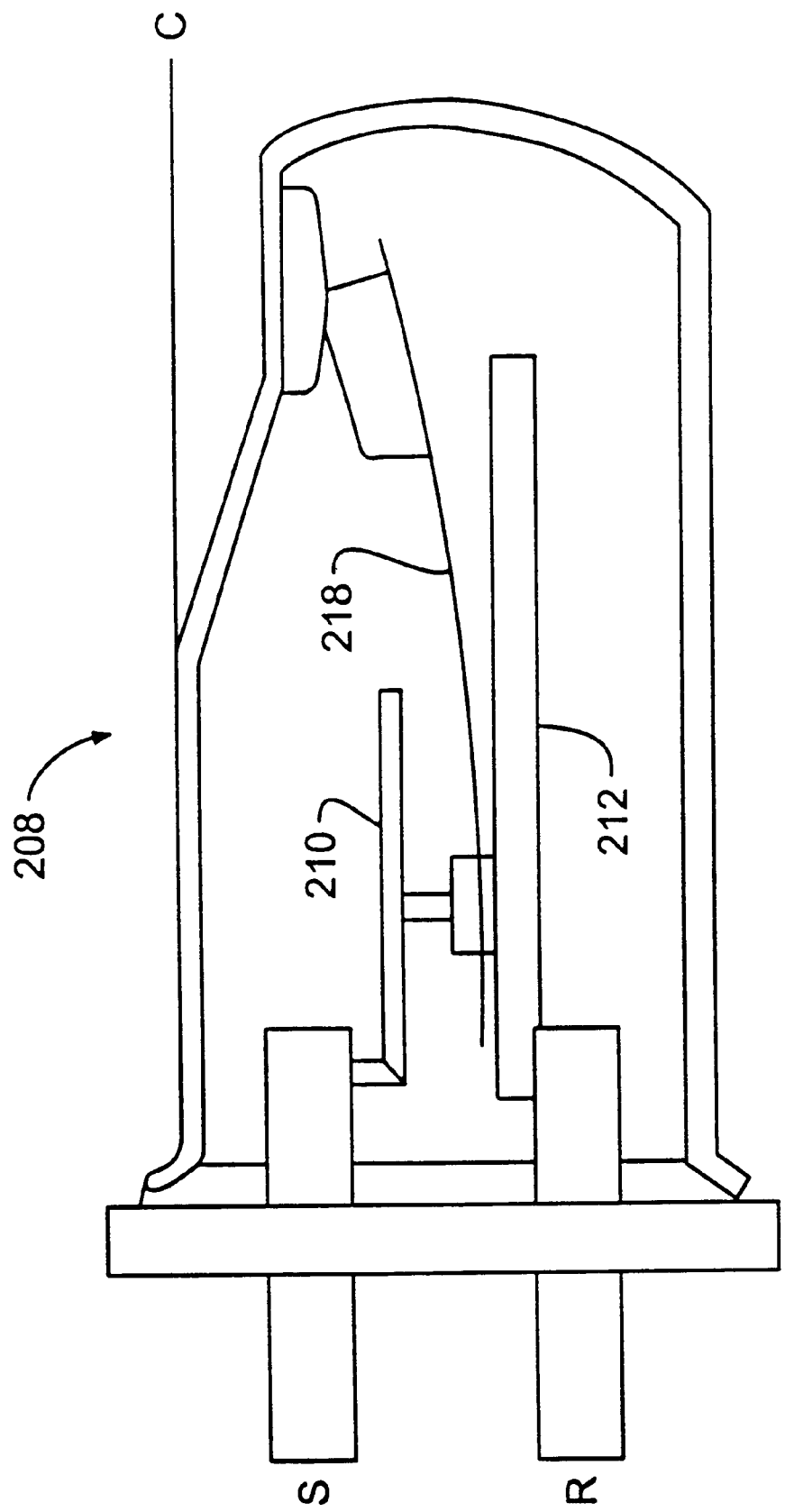
FIG. 49 is a cross-section of a three terminal motor protection according to the present invention.

A unique three terminal motor protection, illustrated generally in FIGS. 30 and 31 and more specifically in FIGS. 48 and 49, is provided with the present invention to protect both motor windings in each operating mode. This is accomplished by employing a heat sensitive switch and two heating devices in the protection element, each device being precisely sized for each operating mode. The heat sensitive switch, for example, is a temperature-sensitive bimetal disc internal to the protector. The protector itself is preferably enclosed in a casing of the compressor to be run by the protected motor.

As shown in FIG. 48, protector 208 includes heater A 210 and heater B 212, which are electrically connected to the motor's start winding 214 and main winding 216 respectively, to provide a variable amount of heat generation internal to the hermetic protector. The amount of heat generation from heater A & B is directly related to the current passing through each heater, which have distinct resistance values. The resistance values of heater A & B are selected according the value of current in the motor windings.

Protector 208 also includes a bimetal disc 208, which also has a distinct resistance value and provides another element of heat generation internal to the protector. The combination of the heat dissipation from heater A 210, heater B 212, bimetal disc 218, and the compressor internal enable the protector to sense fault conditions placed on the compressor.

Upon reaching a set temperature (representative of a fault condition) the bimetal disc 218 snaps open, breaking the common leg of the power to the compressor's motor. This set "opening" temperature is derived from testing of the compressor under varying fault conditions represented by failure to start or running under overload conditions. This "opening" removes power from the compressor motor allowing time for the compressor/system fault condition to be cleared. As the compressor is allowed to cool by the removal of power, the bimetal disk will then snap closed at a set "closing" temperature thus reapplying power to the compressor. At this point, the compressor/system will have cleared the fault and operate as designed, or repeat the fault recognition and open the protector.

In two-cylinder mode when the motor is running at maximum capacity, the motor's main winding 216 is placed across the line and is electrically connected to protector heater B 212. This heater is selected to protect the main winding 216 during high over-current conditions. The motor's start winding 214 is placed across the line with a capacitor in series with the main winding to provide current limiting and phase angle displacement. The start winding is electrically connected to protector heater A 210. Selection of this heater for two-cylinder operation is primarily based upon the start winding's current during conditions such as miswire or a welded contact on a start capacitor relay.

In one-cylinder operation, Heater A primarily protects the start winding from high over-current conditions. Selection of this Heater B for one-cylinder operation is primarily based upon the start winding's current conditions such as miswire or a welded contact on a start capacitor relay.

Air Conditioning Applications

Figure 50:
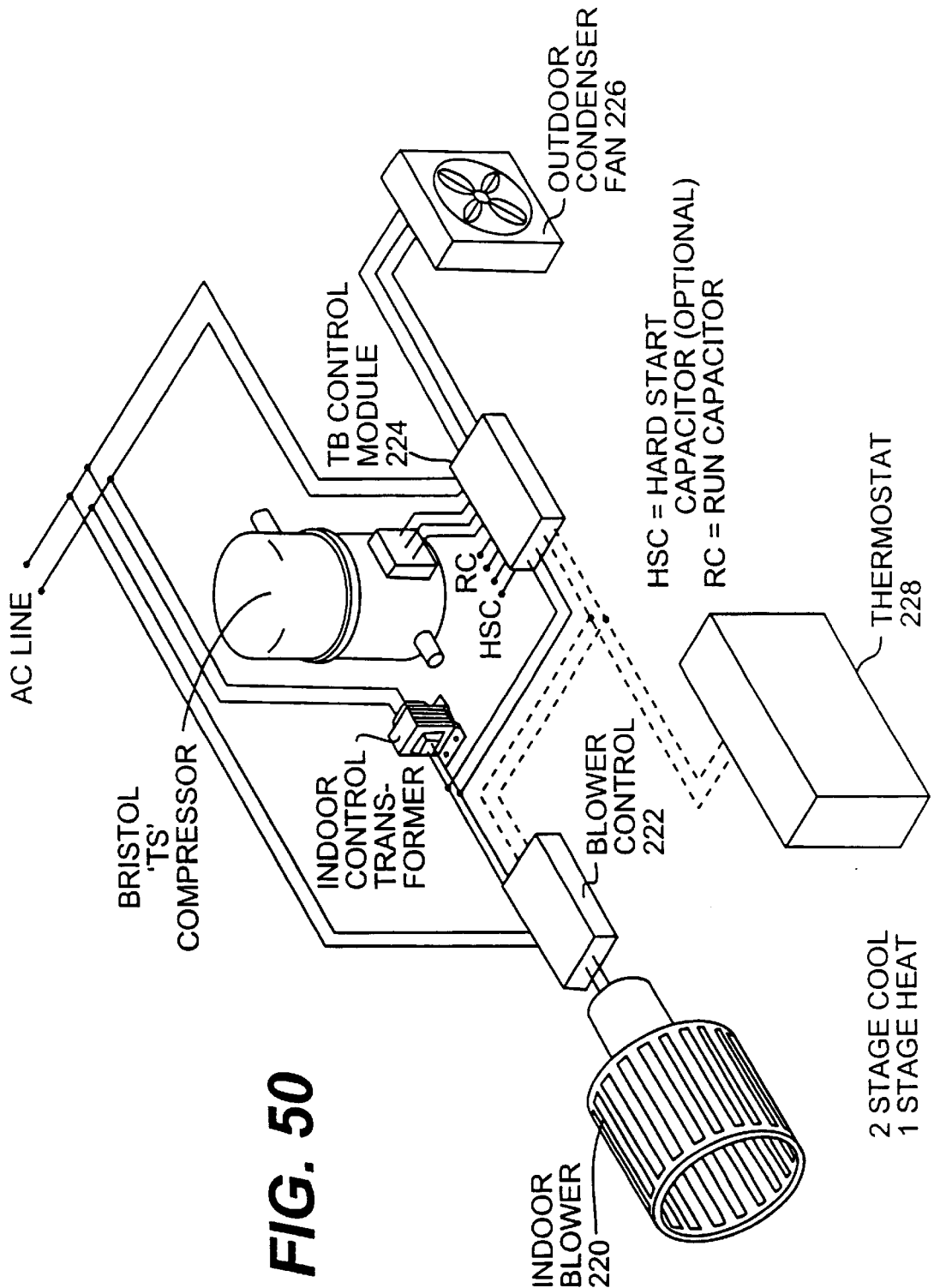
FIG. 50 is a schematic view of an air conditioning system including a two stage compressor.

The two stage compressor of the present invention can be applied effectively to air conditioning systems, particularly two stage air conditioning systems including other two stage components such as a two stage blower motor. An example of such a system is shown in FIG. 50. As in a conventional air conditioning system, the two stage compressor of the present invention would be incorporated into a refrigeration loop including an expansion device, an evaporator, a condenser, and the compressor. The output of the compressor at the first and second stages would be selected to provide a load matched to the maximum rating of the system at the first load and a reduced load at the second. It is believed that the preferred reduced load would be within the range of 40 to 60%, more preferably within the range of 40 to 50%. The motor driving the compressor preferably will be designed to match the two selected load characteristics of the compressor, thereby significantly reducing energy consumption when the compressor is operated at lower load conditions.

The system preferably includes a two stage evaporator blower 220 that operates either at a first fixed maximum power load, or at a second reduced fixed power load. Again the staged loads of the blower motor are selected to match the load requirements of the system associated with the two staged loads of the compressor. Preferably, the blower motor is a two stage motor controlled by a control explained below. The blower motor can also be a variable speed motor, at a higher system cost.

The system preferably also includes an outdoor condenser fan associated with the condenser, and a two stage expansion device in the loop.

The system preferably is controlled by a relatively simple two stage thermostat and control communication with control modules 222 and 224 associated with the compressor and the indoor blower motor respectively. As illustrated in FIG. 50, in the preferred embodiment control module also is in electronic communication with the outdoor condenser fan 226. These control circuits are powered by a lower voltage source of power developed by an indoor control transformer, and each of the working components (compressor, blower motor, and condenser fan) are interconnected with line current, ultimately applied directly or indirectly to the working components through the control modules.

The two stage compressor is preferably a reversible two stage compressor of the type described above, having two cylinders, one of which has a zero stroke when the motor is reversed. The motor preferably runs on the run and start windings, depending upon the direction of rotation, as previously described.

The blower control similarly includes the control module 222 for operating the blower motor at two distinct stages, each stage preferably matched to the stages of the compressor. The control module preferably includes a switching device and a generator for generating a lower frequency power, from line power. In the preferred embodiment, the blower motor runs on line power, e.g. 60 Hz, when operated at maximum load and is switched to operate at the lower frequency power, e.g. 30 Hz, when operated at its lower load (second stage). The blower motor is preferably a single phase induction motor, and the control for the blower motor preferably includes an inverter or waveform generator for generating from line current a second single phase power at a reduced frequency and a switch for connecting either line power or the second source of power to the motor, based on the sensed condition of a two stage thermostat. Preferred embodiments of the blower motor control are described more thoroughly in pending application Ser. No. 09/014,752, filed on Jan. 28, 1998, for Two Step Power Output Motor and application Ser. No. 09/133,840 for Two Step Power Output Motor And Associated HVAC Systems And Methods, filed concurrently with this application.

In the preferred embodiment, the outdoor condenser fan 226 similarly is operated at two or more stages, depending upon the most optimum characteristics of the system. The fan motor can be driven at a single speed, at two stages, or at variable stages.

The system preferably includes a two stage expansion device which is either mechanically controlled or controlled by the electronic control system. In one embodiment the two stage expansion valve includes two orifices with a solenoid switch to select the application of the orifices, the solenoid being connected to the control system. In an alternative embodiment, the expansion valve has two spring loaded orifices in a series which mechanically change, with the load of the compressor. In another alternative embodiment, the expansion valve is a thermostatic expansion valve that has a variable orifice. The size of the variable orifice is changed based on the temperature and pressure of the gas leaving the evaporator.

In the preferred embodiment, the first stages of the compressor and the blower are matched to provide optimum efficiency for maximum cooling capacity of the system, and the second stage represents a decrease in cooling capacity of at least 40%. In one preferred embodiment, the two stage compressor operated at 100% at the first stage and at approximately 40% at the second stage. The two stage expansion valve operates at a first stage when the compressor operates at its first stage and operates at a second stage when the compressor to operates at its second stage.

Preferably, the control system operates the expansion valve, blower motor, and compressor at their first stage when the cooling requirements exceed a preselected value and at the lower stages when the cooling requirements fall below that preselected value. As shown, the control system includes a thermostat 228 and is electrically connected to the motors to the compressor, the blower, and the fan, as well as the expansion device when an electrically controlled device is utilized. Such a control can include a two stage thermostat. By means of example, the thermostat can be one such as available from the WHITE-ROGERS DIVISION of Emerson Electric Co. and described in detail in the four page INSTRUCTIONS booklet, PART No. 37-3421, which publication is hereby incorporated by reference in its entirety.

The cooling system could also be adapted to a multiple evaporator, or mini-split system, to provide further system control of the space to be conditioned. The system can incorporate multiple evaporators with only a single condenser, thereby providing efficiency and cost control. Such a system provides lower installation costs, lower energy costs, and simplified control. It also reduces sound, lower maintenance, is easier to service, and provides high reliability.

In operation, the condition of the space to be cooled is sensed by the thermostat and the compressor and blower motor are operated at their first respective stages when cooling load exceeds a predetermined level. They are operated at their respective second stages when the cooling load falls below that predetermined level. If a two stage condenser fan is included in the system, it also is operated at a second stage when the cooling load falls below the predetermined level. Preferably the evaporators are sized to be equal to or greater than the capacity of the condensers in the system.

Heat Pump Application

The two stage reversible compressor of the present invention also can be applied to heat pump systems and methods, particularly cold climate heat pumps. As is known, heat pumps include a compressor, condenser, expansion device, evaporator, and reversing valve in a refrigerant loop. When the heat pump is in the cooling mode, the refrigerant flows through the loop in one direction. When the heat pump is in the heating mode, the refrigerant flows in the opposite direction. As is known in the art, this is achieved through the operation of the reversing valve and associated control and equipment.

The two stage air conditioning system previously disclosed can be modified to include a reversing valve and controls so that it can operate as a two stage heat pump system which can provide two stages of air conditioning and two stages of heat pump operation. Such a system would thus include a two stage compressor, a two stage blower motor, a two stage or multi-variable expansion valve, and a two stage thermostat.

In cold climate areas where limited cooling is required, the two stage compressor of the present invention has particularly beneficial application to a heap pump system, since it will require fewer components and is more cost effective. As explained in more detail below, in such a system, only the lower stage of the compressor and other equipment are used for cooling, while either the full or lower load capability of the two stage compressor is used to provide heating, depending upon the load conditions.

Figure 51:
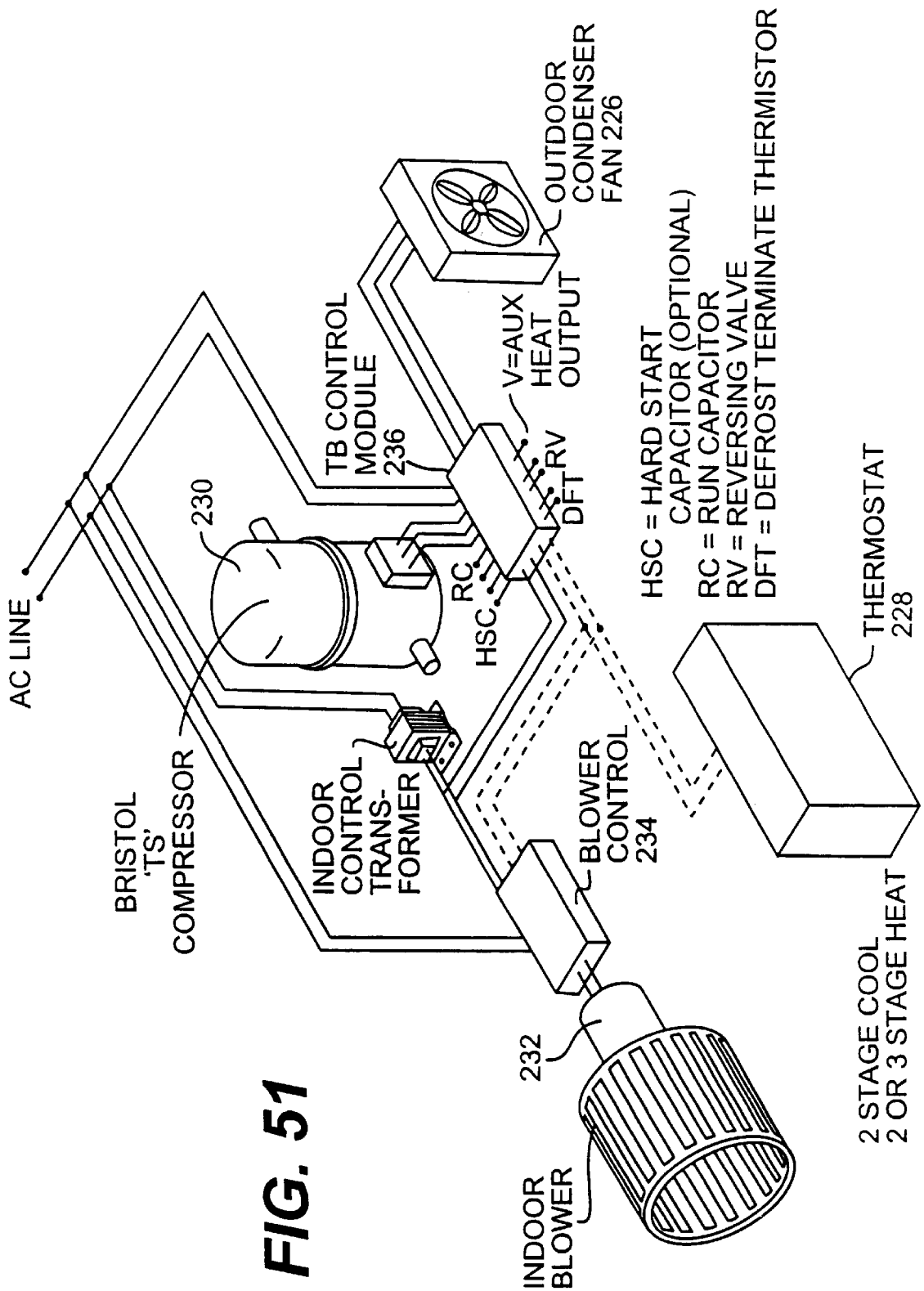
FIG. 51 is a schematic view of a heat pump system including a two stage compressor.

The electrical components and the hook-up of one embodiment of a heat pump according to the present invention is illustrated in FIG. 51. As shown, the system includes a two stage compressor 230, an outdoor condenser fan 226, an indoor blower motor 232, and an outdoor thermostat 228 for controlling the devices. As shown, the system includes a transformer providing control circuit lower voltage, and the components are connected to line current through control modules 234, 236 for each of the compressor, fan, and blower motor. In operation, the cold climate heat pump will cool the space using only the lower stage of the compressor. In the heating mode, the compressor will operate at the first, lower stag until the outdoor temperature, sensed by an outdoor thermostat, falls below a preselected value, i.e. 30° to 40° F. When the sensed outdoor temperature is above the preselected value, the compressor will operate at the lower stage.

Preferably, the compressor is designed to operate on start windings in one direction and the run windings of the other direction, in the manner disclosed above. The outdoor condenser fan 226 or the indoor blower fan can either be one or two stage, but preferably one stage. If two stage motors are used, they can operate under a variety of systems, including the 60/30 Hz system.

The heat pump is preferably designed for cold climate operations for air conditioning loads where air conditioning loads are not as great as heating loads. This heat pump could provide high capacity heating by operating a two stage compressor at high capacity level and satisfy cooling demands by operating at a lower capacity level. This approach would require only simple controls and would be very cost effective. The system would also provide warmer air from the indoor unit, resulting in more customer comfort.

As an example, a system according to the present invention would include an evaporator and condenser sized for one cylinder cooling and capable of operating with two cylinders in a low outdoor ambient heating mode. For example, a two ton air conditioning system would utilize a four ton compressor and would operate on one cylinder (two ton) mode in air conditioning and would use either one or two cylinders (four ton) for heat in cold outdoor ambient conditions.

In the heat pump application, the system provides high heat capability in cold climates and eliminates or greatly reduces the need for auxiliary heat. It is also capable of replacing gas or oil furnaces, while having low energy costs. It similarly provides load matching capability for heating and cooling and fewer and shorter defrost cycles. In addition warmer air is applied from the registers to the spaced to be conditioned, at reduced sound levels.

Overview

The application of the two stage compressor of the present invention to air conditioning and heat pump application provides higher SEER (Seasonal Energy Efficiency Ratio) ratings, lower applied costs for the same SEER rating, potential multiple evaporator operation, standardization, and enhanced comfort. Improvement to existing air conditioning systems can be made without redesigning heat exchangers, sheet metal, and air flow systems. Condensing units for 10, 12, and 14 SEER products can be standardized. In addition, air conditioning operation is more continual, which will provide a more constant indoor temperature along with better humidity control. Another overriding advantage is the cost effectiveness of the system, in comparison with other variable capacity technologies. First, the cost of the system itself is modest because few and relatively inexpensive components are utilized to upgrade conventional systems. Second, operation at the lower stages requires less energy, so that consumers will benefit from lower energy operation costs.

Capacity for the compressors can be split 50/100, 40/100, 60/100, or other ranges that best match the system and load characteristics. This will allow regionalizing products, particularly heat pumps, to overcome the problem of having to compromise heat pump performance to avoid having too much cooling capacity, with a compressor having a single stage. The system also provides improved humidity control and sound level for TS modulating performance.

Applicants believe that the application of the above technology provides the lowest applied costs for unitary products having an 11.0 SEER and above rating. Where a standard compressor yields 10 SEER, a two stage compressor in the same chassis yields 12 SEER. Reducing indoor blower speed by one half or adding a variable speed indoor blower to the two stage compressor system raises it to 13 to 14 SEER, respectively.

As described, the system is particularly applicable to heat pump application, especially in cooler climates. This application tends to postpone the use of supplemental electric strip heating for another 15° F. lower ambient.

The system is adaptable to R-407C and R-410A refrigerant, as well as R-22 refrigerant. It can be utilized in unitary, mini-split and multi-evaporator mini-splits. Other improved characteristics provided by the air conditioning systems of the present invention include reduced number of stops and starts and reduced loads on the bearings, valves, and other components for a major portion of the time, as a result of one cylinder operation. The invention further provides reduced current to the motor for a major portion of the operation, as a result of one cylinder operation.

In the air conditioning mode, the invention provides the lowest system cost for 11.0 SEER and above. It is capable of achieving higher SEER while providing lower energy costs. It also provides load matching capability and the ability to provide a more constant indoor temperature, along with better humidity control. The system and operation is also quieter than average, since the majority of the time it is in single cylinder operation. Similarly, the system has a quieter indoor blower operation and higher reliability due to less cycling, and standardization of product.

The application of the two stage compressor to HVAC systems also appears to provide increased efficiency with R22 refrigerant, at least in some application. A compressor's theoretical efficiency (EER) is the maximum efficiency it can achieve when working in a system with specified evaporator and condenser temperatures and amounts of superheat and subcooling. Theoretical efficiency is found solely from thermodynamic properties. The theoretical efficiency is found by dividing the enthalpy change in the evaporator (h1–h4, in units of Btu/hr) by the enthalpy change through the compressor (h2–h1, in units of Watts). The enthalpy change in the evaporator is a function of the width of the P-h diagram at the evaporator and condenser temperatures. The enthalpy change through the compressor is set by the slope of the constant-entropy lines to the right of the saturated vapor curve. The width of the P-h diagram and the slope of the constant-entropy lines are solely functions of the thermodynamic nature of each refrigerant.

For the typical operation envelope for high temperature compressors (−20° F. to 55° F. evaporator, 80° F. to 150° F. condenser), R22 has higher theoretical efficiencies than R410A. However, for lower condenser temperatures, the difference between the two refrigerants is lower. R410A has a relatively low critical point, resulting in a narrow P-h diagram at high condenser temperatures. Therefore R410A is a poor-performing refrigerant at high condenser temperatures. At lower temperatures, R410A's P-h diagram widens, closer to that of R22. This results in R410A having 7.8% lower theoretical efficiencies at 45/130 but only 2.8% lower at 45/90.

TS compressors running in one-cylinder mode inherently operate at lower condenser temperatures than in two-cylinder mode. The condenser coil is much bigger than needed when the compressor is in one-cylinder mode, so the system can operate with a smaller temperature difference between the coil and the air stream. This in turn allows the condenser to operate at a lower temperature. Therefore, R410A is theoretically much closer to R22 performance in one-cylinder mode than in two-cylinder mode. Indeed, data from TS compressors operating with R22 and R410A seems to indicate that a low condenser temperatures like 100° F. R410A has higher actual efficiency despite having lower theoretical efficiency. R410A has a 40% higher suction density than R22, which allows it to get the same capacity with 40% lower flow speed. This in turn results in lower flow losses, which in turn allows R410A to more closely approach its theoretical efficiency. At lower condenser temperatures, where the two refrigerants have close to the same theoretical efficiency, R410A can then exceed R22 in actual efficiency.

It will be understood that variations and modifications can be effected by the application of the disclosed inventions and their principles. The spirit and scope of the invention are defined by the following claims.

We claim:

1. A two stage compressor comprising:
    a block having a first cylinder and a second cylinder, each of the first and second cylinders having an associated compression chamber and piston;
    a crankshaft operatively connected to said pistons in each of the first and second cylinders;
    an induction motor with a start winding and a run winding, said motor operable to rotate the crankshaft in a forward direction and in a reverse direction; and
    a switch for selectively operating the motor in the forward direction on the run windings and in the reverse direction on the start windings.

2. The motor of claim 1 wherein the run winding is selected to power the motor at a power level compatible with the maximum load of the compressor and the start winding is selected to power the motor at a power level compatible with the minimum load of the compressor.

3. The motor of claim 2 including a control circuit for operating the switch mechanism in response to load requirements of the compressor.

4. The motor of claim 3 wherein said control circuit includes a two stage thermostat.

5. The motor of claim 1 further comprising a capacitor, said capacitor being connected in series with the start winding when the motor operates in the forward direction and being connected in series with the run windings when the motor operates in the reverse direction.

6. The motor of claim 5 wherein said switch includes a delay device for disconnecting electrical power to the motor for a predetermined time before changing its direction of rotation of the motor.

7. The motor of claim 5 further comprising a start assist system for immediately changing the direction of rotation of the motor while it is loaded.

8. A two-stage compressor comprising:
    a block having a first cylinder and a second cylinder, each of the first and second cylinders having an associated compression chamber and piston;
    a crankshaft operatively connected to said pistons in each of the first and second cylinders;
    a single phase reversible induction motor having start and run windings and designed to operate on the run windings when rotating the crankshaft in a first direction and on the start windings when rotating the crankshaft in a second direction; and
    a protector including an enclosure with a heat sensitive switch and a pair of heaters connected to the heat sensitive switch at one end and respectively to the start and run windings of the motor at the other end, whereby when the internal temperature of the protector reaches a preselected temperature, the heat sensitive switch operates to open the circuit and remove the windings from power for a preselected period of time.

9. The protected motor of claim 8 wherein the heat sensitive switch is a bimetal switch.

10. The protected motor of claim 9 wherein the heaters are resistors designed $R_1$ and $R_2$.

11. The protected motor of claim 10 wherein said bimetal switch has a distinct resistance value that provides an additional source of heat.

12. The protected motor of claim 11 wherein the respective resistance values of $R_1$ and $R_2$ are selected to correspond to the value of current to be applied to the windings to which the respective resistors are connected.

13. The protected motor of claim 12 further including a capacitor and a control switch, said start winding and capacitor being in series when the control switch is in a first position and said run winding and capacitor being in series when said control switch is in a second position.

* * * * *